United States Patent
Lee et al.

(10) Patent No.: US 11,501,805 B2
(45) Date of Patent: Nov. 15, 2022

(54) RECEIVERS FOR PERFORMING REFERENCE VOLTAGE TRAINING AND MEMORY SYSTEMS INCLUDING THE SAME

(71) Applicant: SAMSUNG ELECTRONICS CO., LTD., Suwon-si (KR)

(72) Inventors: Sucheol Lee, Suwon-si (KR); Changkyu Seol, Osan-si (KR); Byungsuk Woo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/377,654

(22) Filed: Jul. 16, 2021

(65) Prior Publication Data

US 2022/0199126 A1    Jun. 23, 2022

(30) Foreign Application Priority Data

Dec. 17, 2020    (KR) .......................... 10-2020-0177209

(51) Int. Cl.
  *G11C 5/14*    (2006.01)
  *G11C 11/4074*    (2006.01)

(52) U.S. Cl.
  CPC .......... *G11C 5/147* (2013.01); *G11C 11/4074* (2013.01)

(58) Field of Classification Search
  None
  See application file for complete search history.

(56) References Cited

U.S. PATENT DOCUMENTS

| | | |
|---|---|---|
| 9,237,047 B1 | 1/2016 | Zhang et al. |
| 9,711,189 B1 | 7/2017 | Wang et al. |
| 10,044,539 B2 | 8/2018 | Wu et al. |
| 10,332,573 B2 | 6/2019 | Hong |
| 10,728,063 B2 | 7/2020 | Wang |
| 2019/0394071 A1 | 12/2019 | Farzan et al. |
| 2020/0065267 A1 | 2/2020 | Mayer et al. |
| 2022/0050621 A1* | 2/2022 | Park ...................... G06F 3/0604 |
| 2022/0059139 A1* | 2/2022 | Park ...................... G11C 29/028 |
| 2022/0059156 A1* | 2/2022 | Park ...................... G11C 11/4096 |
| 2022/0121388 A1* | 4/2022 | Woo ....................... G06F 3/0679 |
| 2022/0199126 A1* | 6/2022 | Lee ....................... G11C 11/4074 |

* cited by examiner

Primary Examiner — Khamdan N. Alrobaie
(74) Attorney, Agent, or Firm — F. Chau & Associates, LLC

(57) ABSTRACT

A receiver including: a data processing circuit, in a training mode, to compare a multi-level signal with first and second voltage signals, and to generate data density signals; a counter circuit to count the data density signals to generate counting values; a control circuit to store, in a register set, a voltage range, counting values corresponding to the voltage range and a control code associated with a first level of the first voltage signal and a second level of the second voltage signal, the voltage range being based on the first and second voltage signals; and a voltage generation circuit, in the training mode, to apply the first and second voltage signals to the data processing circuit and to increase the first level and the second level by a difference between the first and second control signals in response to the control code from the control circuit.

20 Claims, 24 Drawing Sheets

RECEIVERS FOR PERFORMING REFERENCE VOLTAGE TRAINING AND MEMORY SYSTEMS INCLUDING THE SAME

CROSS-REFERENCE TO RELATED APPLICATION

This application claims priority under 35 U.S.C. § 119 to Korean Patent Application No. 10-2020-0177209, filed on Dec. 17, 2020 in the Korean Intellectual Property Office, the disclosure of which is incorporated by reference herein in its entirety.

Technical Field

Example embodiments of the present disclosure relate generally to semiconductor integrated circuits, and more particularly to receivers for performing reference voltage training and memory systems including the same.

Discussion of the Related Art

Semiconductor memory devices can generally be divided into two categories depending on whether or not they retain stored data when disconnected from a power supply. The two categories of memory devices include volatile memory devices, which lose stored data when disconnected from power, and nonvolatile memory devices, which retain stored data when disconnected from power. Volatile memory devices may perform read and write operations at a high speed, but require electric current to retain data and thus lose content stored therein in the absence of power. Nonvolatile memory devices may retain content stored therein even after power is removed, and as such, they may be used to store data that must be retained regardless of whether the memory devices are powered or not.

A high communication speed (or interface speed) can be employed between a memory controller and the semiconductor memory device. In such a case, a multi-level signaling technique, in which a plurality of bits are transmitted during one unit interval WI), may be employed.

SUMMARY

Some example embodiments of the present disclosure provide a receiver in a semiconductor memory device, the receiver capable of performing reference voltage training based on a distribution of voltage levels without original data.

Some example embodiments of the present disclosure provide a memory system including a receiver, the receiver capable of performing reference voltage training based on a distribution of voltage levels without original data.

According to some example embodiments of the present disclosure, there is provided a receiver included in a semiconductor memory device, the receiver including: a data processing circuit, in a training mode, configured to compare a multi-level signal with a first voltage signal and compare the multi-level signal with a second voltage signal having a first difference with respect to the first voltage signal, and configured to generate data density signals indicating a number of symbols associated with the multi-level signal between the first voltage signal and the second voltage signal, the multi-level signal having, one of M voltage levels different from each other, M being an integer greater than two; a counter circuit configured to perform a counting operation on the data density signals to generate counting, values; a control circuit configured to store, in a register set, a voltage range, counting values corresponding to the voltage range and a control code associated with a first level of the first voltage signal and a second level of the second voltage signal, the voltage range being based on the first voltage signal and the second voltage signal; and a voltage generation circuit, in the training mode, configured to apply the first voltage signal and the second voltage signal to the data processing circuit and configured to increase the first level of the first voltage signal and the second level of the second voltage level by the first difference in response to the control code from the control circuit, and wherein the control circuit is configured to perform a reference voltage training to select a control code associated with a reference voltage provided to the data processing circuit in a normal mode, based on counting values stored in the register set.

According to some example embodiments of the present disclosure, there provided a memory system including a memory controller configured to generate a multi-level signal based on input data, the multi-level signal having one of M voltage levels different from each other, M being an integer greater than two; and a semiconductor memory device including at least one receiver configured to receive the multi-level signal from the memory controller and configured to compare the multi-level signal with (M−1) reference voltages to generate a target data signal including N bits, N being an integer greater than one, wherein the at least one receiver includes: a data processing circuit, in a training mode, configured to compare the multi-level signal with a first voltage signal and compare min-level signal with a second voltage signal having a first difference from the first voltage signal, and configured to generate data density signals indicating a number of symbols associated with the multi-level signal between the first voltage signal and the second voltage signal; a counter circuit configured to perform a counting operation on the data density signals to generate counting values; a control circuit configured to store, in a register set, a voltage range, counting values corresponding to the voltage range and a control code associated with a first level of the first voltage signal and a second level of the second voltage signal, the voltage range being based on the first voltage signal and the second voltage signal; and a voltage generation circuit, in the training mode, configured to apply the first voltage signal and the second voltage signal to the data processing circuit and configured to increase the first level of the first voltage signal and the second level of the second voltage signal by the first difference in response to the control code from the control circuit, and wherein the control circuit is configured to perform a reference voltage training to select a control code associated with a reference voltage provided to the data processing circuit in a normal mode, based on the counting values stored in the register set.

According to some example embodiments of the present disclosure, there is provided a receiver included in a semiconductor memory device, the receiver including: a data processing circuit, in a training mode, configured to consecutively compare a multi-level signal with a first voltage signal and a second voltage signal having a first difference from the first voltage, and configured to generate first, second and third data density signals indicating a number of symbols associated with the multi-level signal distributed between the first voltage signal and the second voltage signal, the multi-level signal having one of first, second, third and fourth voltage levels different from each other; a counter circuit configured to perform a counting operation on the first through third data density signals to generate first, second and third counting values; a control circuit configured to store, in a register set therein, a voltage range, the first through third counting values corresponding, to the voltage range and a control code associated with a first level of the first voltage signal and a second level of the second voltage signal, the voltage range being based on the first voltage signal and the second voltage signal; and a voltage generation circuit, in the training mode, configured to apply the first voltage signal and the second voltage signal to the data processing circuit and configured to increase the first level and the second level by the first difference step-wisely in response to the control code from the control circuit, wherein the control circuit is configured to perform a reference voltage training to select a control code associated with a reference voltage provided to the data processing circuit in a normal mode, based on the first through third counting values stored in the register set, the control circuit is configured to provide the voltage generation circuit with control codes associated with a minimum voltage range corresponding to a minimum counting value among a respective one of the first through third counting values stored in the register set, as first, second and third selected control codes, and the voltage generation circuit is configured to provide first, second and third reference voltages to the data processing circuit response to a respective one of the first through third selected control codes in the normal mode.

Accordingly, the receiver and the memory system including the receiver according to example embodiments of the present disclosure, in the training mode, perform a reference voltage training by counting a number of symbols associated with the multi-level data in each of voltage ranges, store the counting values and determine a reference voltage associated with a minimum counting value among the stored punting values and thus may determine the reference voltage optimally without original data. Therefore, the receiver may perform the reference voltage training on reference voltages concurrently and may enhance performance.

BRIEF DESCRIPTION OF THE DRAWINGS

The above and other features of the present disclosure will become more apparent by describing in detail example embodiments thereof with reference to the accompanying drawings.

DETAILED DESCRIPTION OF EMBODIMENTS

Figure 1:
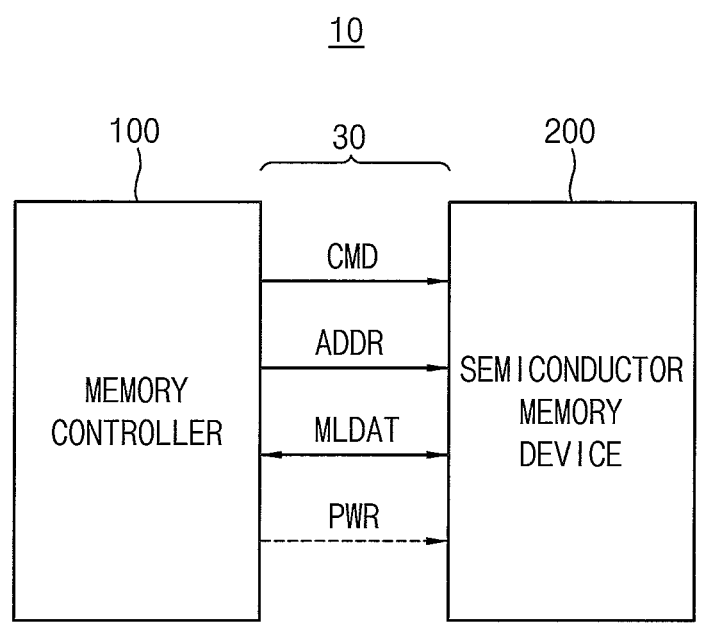
FIG. 1 is a block diagram illustrating a memory system according to one or more example embodiments of the present disclosure.

Example embodiments of the present disclosure will be described more fully hereinafter with reference to the accompanying drawings. Like reference numerals may refer to like elements throughout the accompanying drawings.

A multi-level signaling scheme may be used to compress the bandwidth required to transmit data at a given bit rate. In a simple binary scheme, two single symbols, usually two voltage levels, may be used to represent '1' and '0,' and thus the symbol rate may be equal to the bit rate. In contrast, the multi-level signaling scheme may use a larger alphabet of m symbols to represent data, so that each symbol may represent more than one bit of data. As a result, the number of symbols that needs to be transmitted may be less than the number of bits (e.g., the symbol rate may be less than the bit rate), and thus, the bandwidth may be compressed. The alphabet of symbols may be constructed from a number of different voltage levels. For example, in a four-level signaling scheme, groups of two data bits may be mapped to one of four symbols. In this case, only one symbol needs be transmitted for each pair of data bits, so that the symbol rate may be a half of the bit rate.

In other words, the multi-level signaling scheme may be used to increase a data transmission (or transfer) rate without increasing the frequency of data transmission and/or a transmission power of the communicated data. An example of the multi-level signaling scheme may be a pulse amplitude modulation (PAM) scheme, where a unique symbol of a multi-level signal may represent a plurality of bits of data. The number of possible pulse amplitudes in a digital PAM scheme may be a power of two. For example, there may be 22 possible discrete pulse amplitudes in a 4-level PAM (e.g., in PAM4), there may be 23 possible discrete puke amplitudes in an 8-level PAM (e.g., in PAM8), and there may be 24 possible discrete pulse amplitudes in a 16-level PAM (e.g., in PAM16). However, example embodiments of the present disclosure are not limited thereto, and the example embodiments described herein may be applied or employed to a M-level PAM (e.g., PAM(M)) having M possible pulse amplitudes, where M is a natural number greater than or equal to three.

FIG. 1 is a block diagram illustrating a memory system according to one or more example embodiments of the present disclosure.

Referring to FIG. 1, a memory system 10 includes a memory controller 100 and a semiconductor memory device 200. The memory system 10 may further include a plurality of signal lines 30 that electrically connect the memory controller 100 with the semiconductor memory device 200.

The semiconductor memory device 200 is controlled by the memory controller 100. For example, based on requests from a host, the memory controller 100 may store (e.g., write or program) data into the semiconductor memory device 200, or may retrieve (e.g., read or sense) data from the semiconductor memory device 200. In other words, the memory controller 100 may write or program data or information into the semiconductor memory device 200, or may read or sense data or information from the semiconductor memory device 200.

The plurality of signal lines 30 may include control lines, command lines, address lines, data input/output (I/O) lines and power lines. The memory controller 100 may transmit a command CMD, an address ADDR, and a control signal CTRL to the memory device 200 via the command lines, the address lines and the control lines, may exchange a data signal MLDAT with the semiconductor memory device 200 via the data I/O lines, and may transmit a power supply voltage PWR to the semiconductor memory device 200 via the power lines.

The data signal MLDAT may be the multi-level signal that is generated and transmitted according to one or more example embodiments of the present disclosure. According to an example embodiment of the present disclosure, the plurality of signal lines 30 may further include data strobe signal (DQS) lines for transmitting a DQS signal.

In some example embodiments of the present disclosure, at least a part or all of the signal lines 30 may be referred to as a channel. The term "channel" may refer to signal lines that include the data I/O lines for transmitting the data signal MLDAT however, example embodiments of the present disclosure are not limited thereto, and the channel may further refer to the command lines for transmitting the command CMD and/or the address lines for transmitting the address ADDR.

Figure 2:
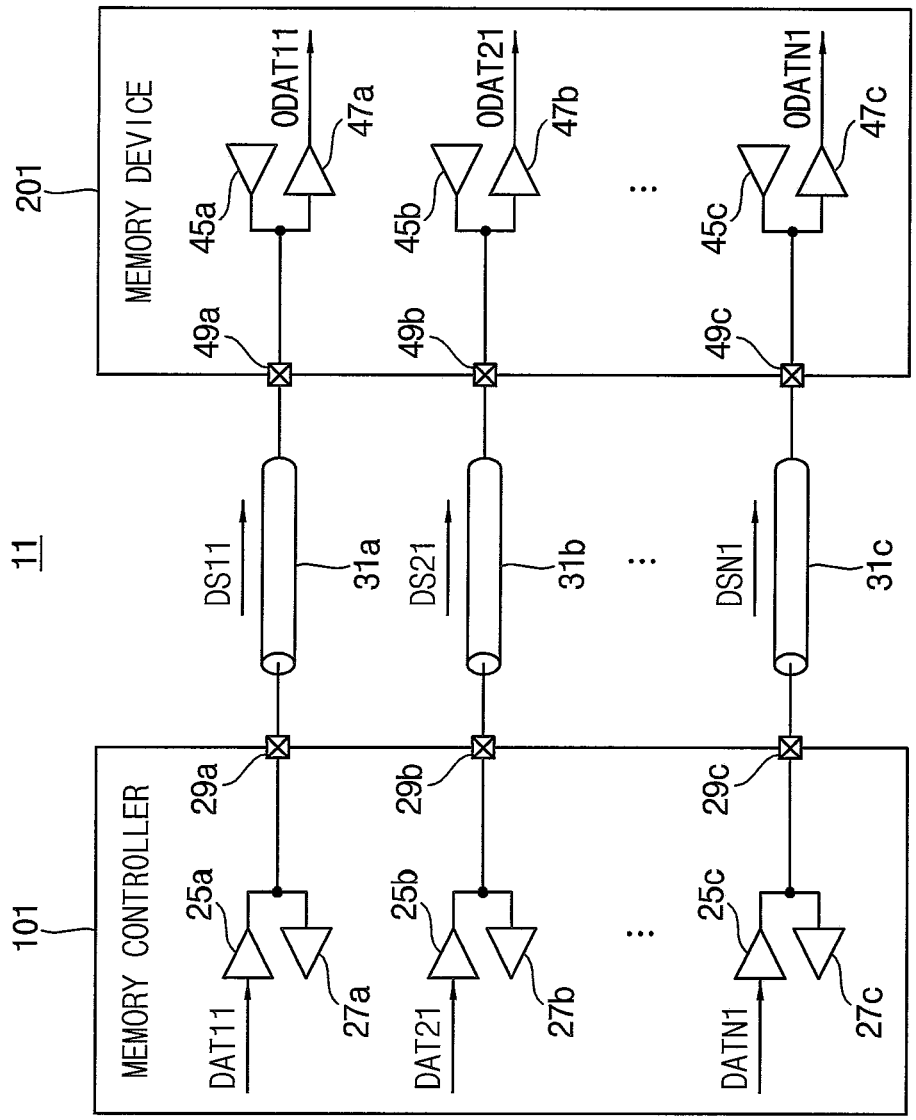
FIGS. 2 and 3 are block diagrams illustrating a memory system of FIG. 1 according to one or more example embodiments of the present disclosure.
Figure 3:
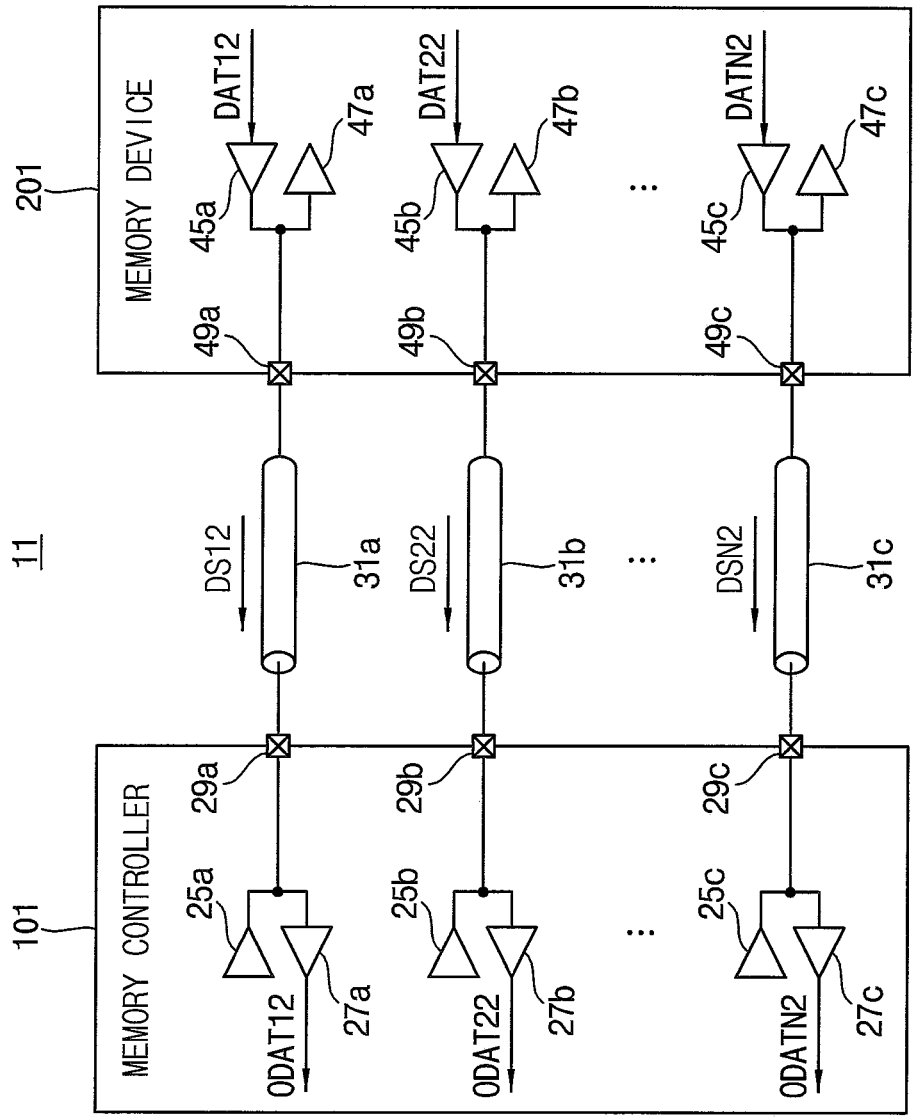

FIGS. 2 and 3 are block diagrams illustrating a memory system of FIG. 1 according to one or more example embodiments of the present disclosure.

Referring to FIGS. 2 and 3, a memory system 11 includes a memory controller 101, a semiconductor memory device 201 and a plurality of channels 31a, 31b and 31c.

The memory controller 101 may include a plurality of transmitters 25a, 25b and 25c, a plurality of receivers 27a, 27b and 27c, and a plurality of data I/O pads 29a, 29b and 29c. The semiconductor memory device 201 may include a plurality of transmitters 45a, 45b and 45c, a plurality of receivers 47a, 47b and 47c, and a plurality of data I/O pads 49a, 49b and 49c. Although FIGS. 2-3 illustrate three sets of channels, receivers, transmitters and data. I/O pads, the present disclosure is not limited thereto. For example, the number of the channels, receivers, transmitters and data I/O pads may be greater or less than three.

Each of the plurality of transmitters 25a, 25b, 25c, 45a, 45b and 45c may generate a multi-level signal. For example, each of the plurality of transmitters 25a, 25b, 25c, 45a, 45b and 45c may perform a method of generating multi-level signal. Each of the plurality of receivers 27a, 27b, 27c, 47a, 47b and 47c may receive the multi-level signal. The plurality of transmitters 25a, 75b, 25c, 45a, 45b and 45e and the plurality of receivers 27a, 27b, 27c, 47a, 47b and 47c may transmit and receive multi-level signal through the plurality of channels 31a, 31b and 31c.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory controller 101 with the semiconductor memory device 201.

Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. For example, the channel 31a may be connected to the transmitter 25a and the receiver 27a through the data pad 29a. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data pads 49a, 49b and 49c. For example, the channel 31a may be connected to the transmitter 45a and the receiver 47a through the data I/O pad 49a. The multi-level signal may be transmitted through each of the plurality of channels 31a, 31b and 31c.

FIG. 2 illustrates an operation of transferring data from the memory controller 101 to the semiconductor memory device 201. For example, the transmitter 25a may generate an output data signal, which is the multi-level signal, based on input data DAT11. The output data signal DS11 may be transmitted from the memory controller 101 to the memory device 201 through the channel 31a, and the receiver 47a may receive the output data signal DS11 to obtain data ODAT11 corresponding to the input data DAT11.

Similarly, the transmitter 25b may generate an output data signal DS21, which is the multi-level signal, based on input data DAT21. The output data signal DS21 may be transmitted to the memory device 201 through the channel 31b, and the receiver 47b may receive the output data signal DS21 to obtain data ODAT21 corresponding to the input data DAT21. The transmitter 25c array generate an output data signal DSN1, which is the multi-level signal, based on input data DATN1. The output data signal DSN1 may be transmitted to the semiconductor memory device 201 through the channel 31c, and the receiver 47c may receive the output data signal DSN1 to obtain data ODATN1 corresponding to the input data DATN1. For example, the input data DAT11, DAT21 and DATN1 may be write data to be written into the semiconductor memory device 201.

FIG. 3 illustrates an operation of transferring data from the semiconductor memory device 201 to the memory controller 101. For example, the transmitter 45a may generate an output data signal DS12, which is the multi-level signal, based on input data DAT12. The output data signal DS12 may be transmitted from the memory device 201 to the memory controller 101 through the channel 31a, and the receiver 27a may receive the output data signal DS12 to obtain data ODAT12 corresponding, to the input data DAT12.

Similarly, the transmitter 45b may generate an output data signal DS22, which is the multi-level signal, based on input data DAT22. The output data signal DS22 may be transmitted to the memory controller 101 through the channel 31b, and the receiver 27b may receive the output data signal DS22 to obtain data ODAT22 corresponding to the input data DAT22. The transmitter 45c may generate an output data signal DSN2, which is the multi-level signal, based on input data DATN2. The output data signal DSN2 may be transmitted to the memory controller 101 through the channel 31c, and the receiver 27c may receive the output data signal DSN2 to obtain data ODATN2 corresponding to the input data DATN2. For example, the input data DAT12, DAT22 and DATN2 may be read data retrieved from the semiconductor memory device 201.

Figure 4:
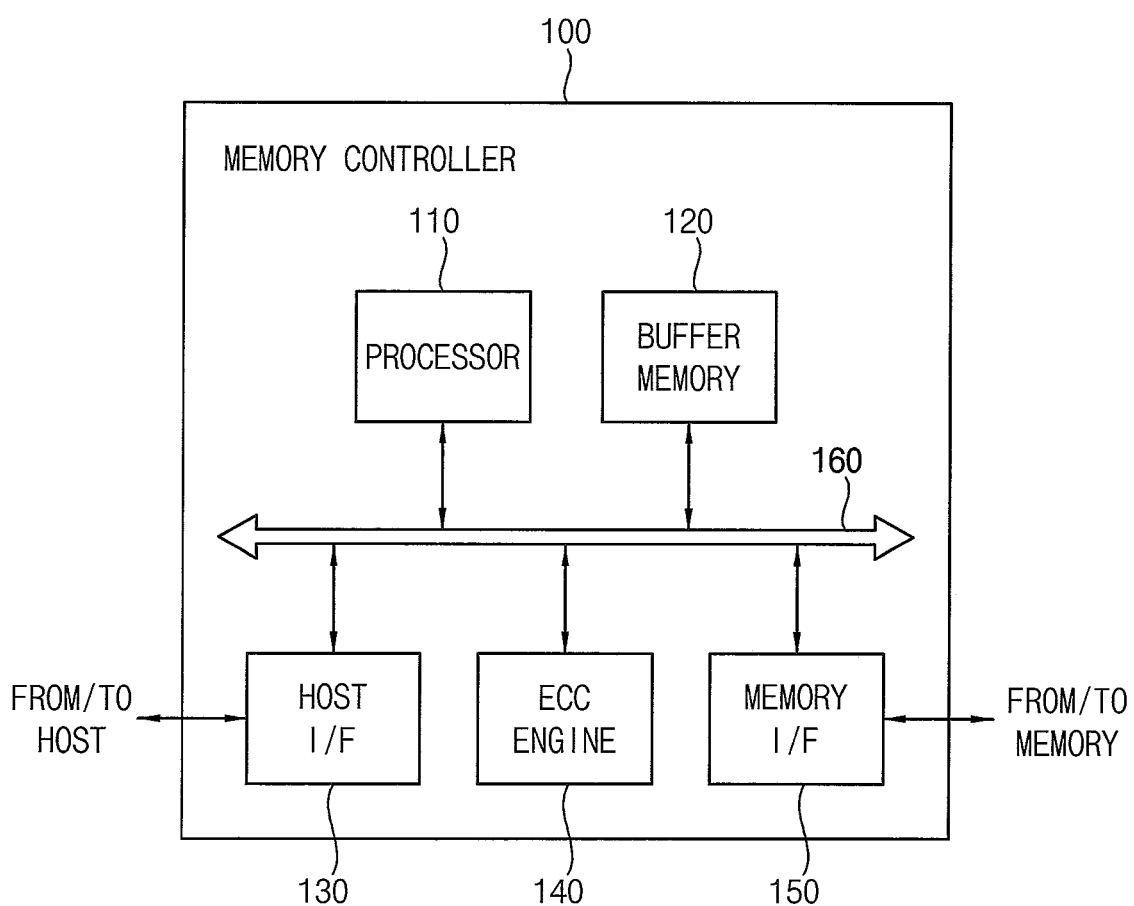
FIG. 4 is a block diagram illustrating a memory controller included in a memory system according to one or more example embodiments of the present disclosure.

FIG. 4 is a block diagram illustrating a memory controller included in a memory system according to one or more example embodiments of the present disclosure.

Referring to FIG. 4, a memory controller 100 may include at least one processor 110, a buffer memory 120, a host interface (I/F) 130, an error correction code (ECC) engine 140 and a memory interface (I/F) 150.

The processor 110 may control an operation of the memory controller 100 in response to a command and/or request received via the host interface 130 from an external host. For example, the processor 110 may control respective components by employing firmware for operating a memory device (the semiconductor memory device 200 in FIG. 1).

The buffer memory 120 may store instructions and data executed and processed by the processor 110. For example, the buffer memory 120 may be a volatile memory device such as a dynamic random access memory (DRAM), a static random access memory (SRAM), a cache memory, or the like.

The host interface 130 may provide physical connections between the host and the memory controller 100. The host interface 130 may provide an interface corresponding to a bus format of the host for communication between the host and the memory controller 100.

The ECC engine 140 for error correction ma perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using above-described codes or other error correction codes.

The memory interface 150 may exchange data with the semiconductor memory device 200. The memory interface 150 may transmit a command and an address to the semiconductor memory device 200, and may transmit data to the semiconductor memory device 200 or receive data read from the semiconductor memory device 200. According to an example embodiment of the present disclosure, a transmitter that generates the multi-level signal according to one or more example embodiments of the present disclosure and a receiver that receives the multi-level signal may be included in the memory interface 150. According to an example embodiment of the present disclosure, the transmitter may be the transmitter 25a illustrated in FIG. 2 and the receiver may be the receiver 27a illustrated in FIG. 2. However, the transmitter may be the transmitter 25b illustrated in FIG. 2 and the receiver may be the receiver 27b illustrated in FIG. 2.

Figure 5A:
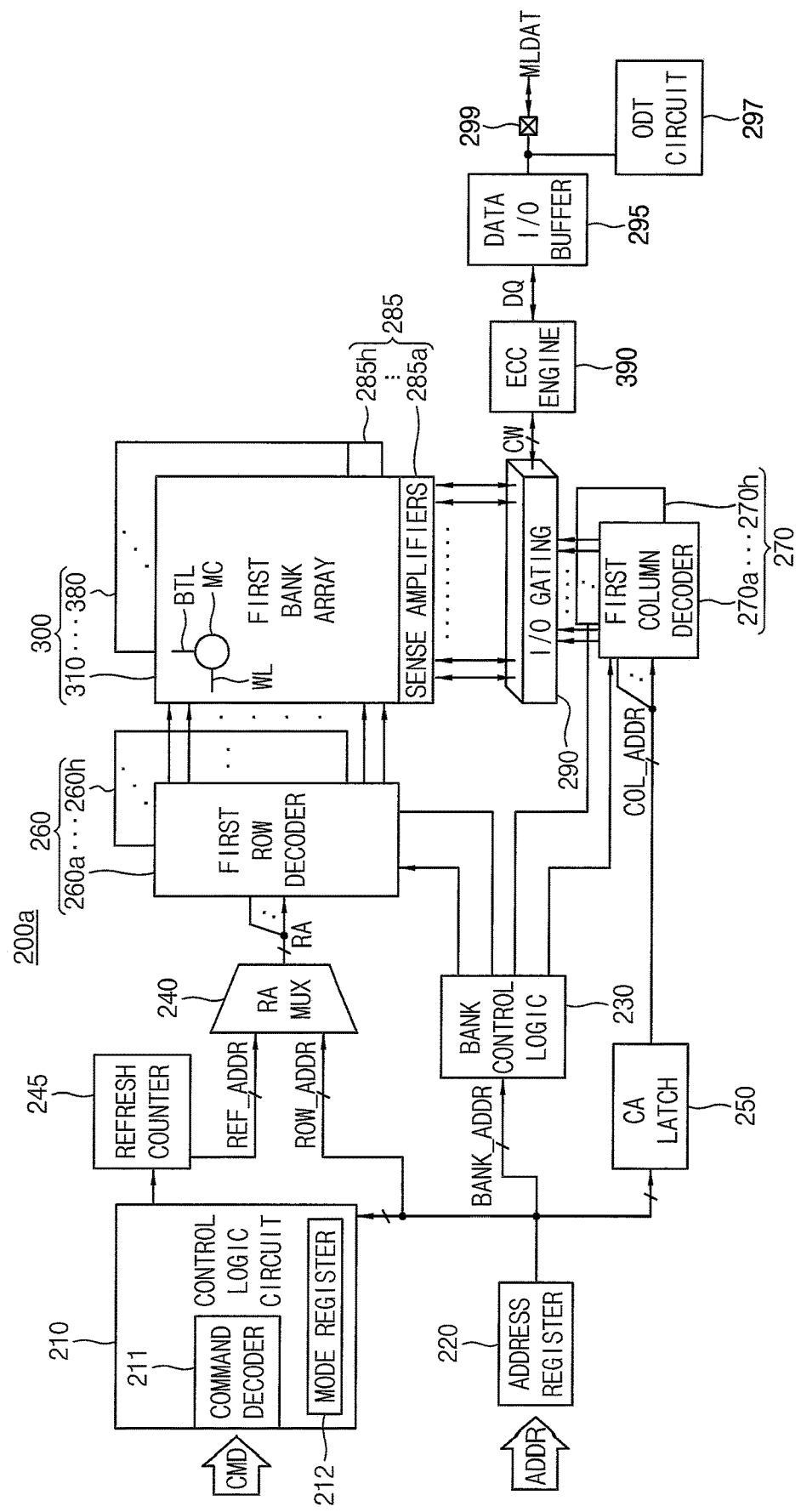
FIG. 5A is a block diagram illustrating the semiconductor memory device included in the memory system of FIG. 1 according to one or more example embodiments of the present disclosure.

FIG. 5A is a block diagram illustrating the semiconductor memory device included in the memory system of FIG. 1 according to one or more example embodiments of the present disclosure.

Referring to FIG. 5A, the semiconductor memory device 200a includes a control logic circuit 210, an address register 220, a bank control logic 230, a refresh counter 245, a row address (RA) multiplexer 240, a column address (CA) latch 250, a row decoder 260, a column decoder 270, a memory cell array 300, a sense amplifier unit 285, an I/O gating circuit 290, an error correction code (ECC) engine 390, an on-die termination (ODT) circuit 297, a data I/O buffer 295 and a data I/O pad 299.

According to one or more example embodiments of the present disclosure, the semiconductor memory device 200a may be a volatile memory device and may include a dynamic random access memory (DRAM) device. For example, the DRAM device may be the memory cell array 300.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth hank arrays 310~380.

The first through eighth bank arrays 310~380, the first through eighth hank row decoders 260a~260h, the first through eighth bank column decoders 270a~270h and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-lines BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the batik address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_DDR from the address register 220, and receives a refresh row address REF_DDDR from the refresh counter 245. The row address multiplexer 240 selectively outputs the row address ROW_ADDR or the refresh row address REF_ADDR as a row address RA to the row decoder 260. The row address RA that is output from the row address multiplexer 240 is applied to the first through eighth bank row decoders 260a~260h.

The refresh counter 245 may sequentially increase or decrease the refresh row address REF_ADDR under control of the control logic circuit 210.

The activated one of the first through eighth bank row decoders 260a~260h, by the bank control logic 230, decodes the row address RA that is output from the row address multiplexer 240, and activates a word-line corresponding to the row address RA. For example, the activated bank row decoder applies a word-line driving voltage to the word-line corresponding to the row address.

The column address latch 250 receives the column address COL_ADR from the address register 120, and temporarily stores the received column address COL_ADDR. In some embodiments of the present disclosure, in a burst mode, the column address latch 250 generates column addresses that increment from the received column address COL_ADDR. The column address latch 250 applies the temporarily stored or generated column address to the first through eighth bank column decoders 270a~270h.

The activated one of the first through eighth bank column decoders 270a~270h activates a sense amplifier corresponding to the bank address BANK_ADDR and the column address COL_ADDR through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380.

A codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 390.

The data DQ to be written in one bank array of the first through eighth bank arrays 310~380 may be provided to the data I/O buffer 295 from the memory controller 100, or may be provided to the ECC engine 390 from the data I/O buffer 295. For example, the ECC engine 390 may perform an ECC encoding on the data DQ to generate parity bits, the ECC engine 390 may provide the data DQ and the parity bits to the I/O gating circuit 290 and the I/O gating circuit 290 may write the data DQ and the parity bits in a sub-page in one bank array through the write drivers. The data DQ may be referred to as a target data signal DQ and a data signal DQ in the present disclosure.

The data I/O buffer 295 may provide the target data signal DQ to the ECC engine 390 in a write operation of the semiconductor memory device 200a, and may provide the data signal DQ from the ECC engine 390 to the memory controller 100 in a read operation of the semiconductor memory device 200a. The data I/O buffer 295 may include receiver according to example embodiments of the present disclosure, may decode a multi-level data MLDAT into a target data signal and may provide the target data signal to the ECC engine 390 in a write operation.

The ECC engine 390 may perform an ECC encoding and an ECC decoding on the target data signal DQ according to a control of the control logic circuit 210.

The control logic circuit 210 may control operations of the semiconductor memory device 200a. For example, the control logic circuit 210 may generate control signals for the semiconductor memory device 200a to perform a write operation or a read operation. The control logic circuit 210 includes a command decoder 211 that decodes the command CMD received from the memory controller 100 and a mode register 212 that sets an operation mode of the semiconductor memory device 200a.

For example, the command decoder 211 may generate the control signals corresponding to the command CMD by decoding a write enable signal, a row address strobe signal, a column address strobe signal, a chip select signal, etc.

The ODT circuit 297 may be connected to the data 10 pad 299 and the data I/O buffer 295. When the ODT circuit 297 is enabled, the ODT circuit 297 may perform an on-die termination (ODT) operation. When the our operation is performed, signal integrity of transmitted/received signal may be enhance by preventing signal reflection due to impedance matching.

Although the memory device included in the memory system according to example embodiments of the present disclosure is described based on a DRAM, the memory device according to example embodiments of the present disclosure may be any volatile memory device, and/or any nonvolatile memory device, a flash memory, a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 5B:
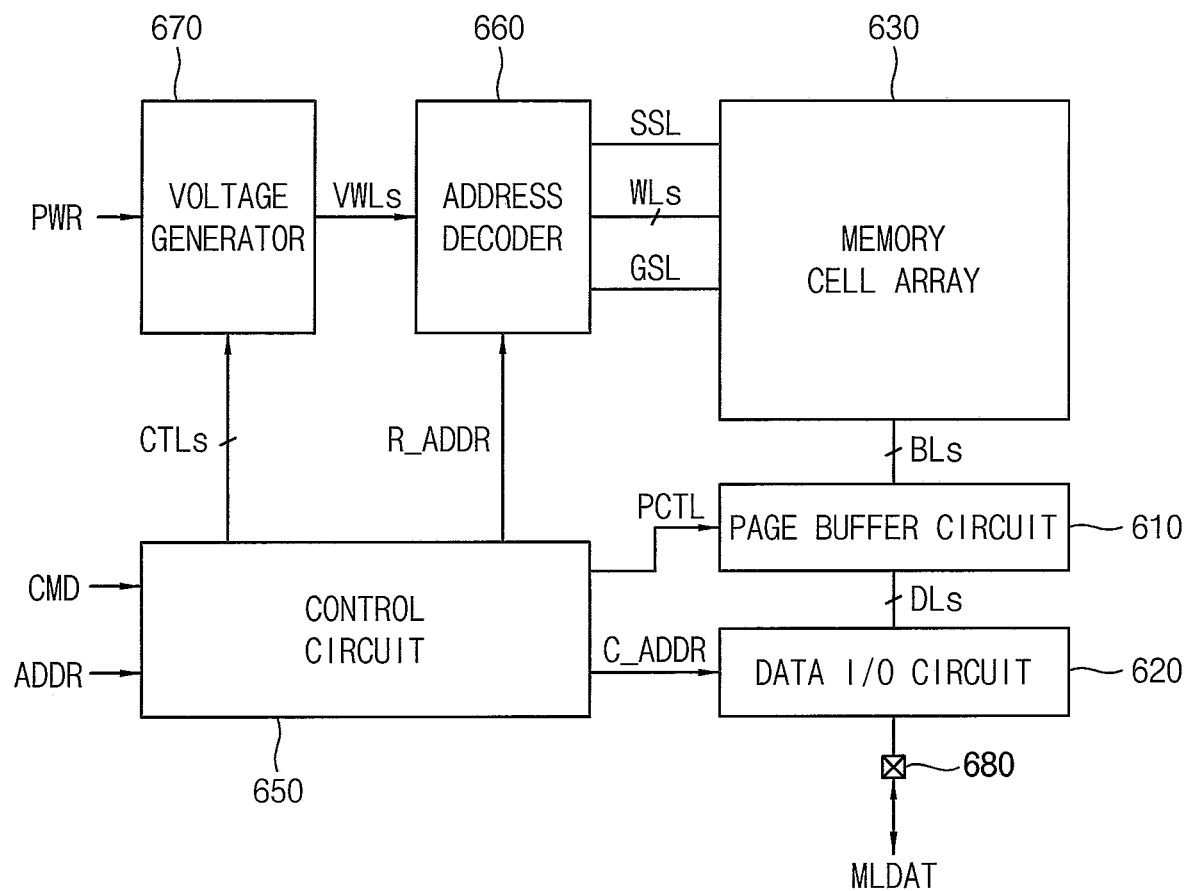
FIG. 5B is a block diagram illustrating the semiconductor memory device included in the memory system of FIG. 1 according to one or more example embodiments of the present disclosure.

FIG. 5B is a block diagram illustrating the semiconductor memory device included in the memory system of FIG. 1 according to one or more example embodiments of the present disclosure.

Referring to FIG. 5B, the semiconductor memory device 200b may be a nonvolatile memory device and may include a memory cell array 630, an address decoder 660, a page buffer circuit 610, a data input/output (I/O) circuit 620, a control circuit 650, a voltage generator 670, and a data I/O pad 690.

The memory cell array 630 is coupled to the address decoder 660 through a string selection line SSL, a plurality of word lines WLs, and a ground selection line GSL. In addition, the memory cell array 630 is coupled to the page buffer circuit 610 through a plurality of bit-lines BLs. The memory cell array 630 includes a plurality of nonvolatile memory cells coupled to the plurality of word lines WLs and the plurality of bit lines BLs.

The control circuit 650 may receive the command signal CMD and the address signal ADDR from the memory controller 100 and control an erase loop, a program loop, and a read operation of the nonvolatile memory device 200b based on the command signal CMD and the address signal ADDR. The erase loop may include an erase operation and an erase verify operation and the program loop may include a program operation and a program verify operation.

For example, the control circuit 650 may generate control signals which are used for controlling the voltage generator 670, based on the command signal CMD, and generate a row address R_ADDR and a column address C_ADDR based on the address signal ADDR. The control circuit 650 may provide the row address R_ADDR to the address decoder 660 and provide the column address C_ADDR to the data input/output circuit 620.

For example, the address decoder 660 is coupled to the memory cell array 630 through the string selection line SSL, the plurality of word-lines WLs, and the ground selection line GSL. The address decoder 660 may determine one of the word-lines WLs as a first word-line (e.g., a selected word-line) and other word-lines of the word-lines WLs as unselected word-lines based on the row address R_ADDR from the control circuit 650 in a program operation and a read operation.

For example, the voltage generator 670 generates word-line voltages VWLs using the power PWR, which are used for the operation of the nonvolatile memory device 200b, based on the control signals CTLs. The word line voltages WLs are applied to the plurality of word lines WLs through the address decoder 660.

For example, during the program operation, the voltage generator 370 may apply a program voltage to the selected word-line and may apply a program pass voltage to the unselected word-lines. In addition, during the program verification operation, the voltage generator 670 may apply a program verification voltage to the selected word-line and may apply a verification pass voltage to the unselected word-lines. In addition, during the read operation, the voltage generator 670 may apply a read voltage to the selected word-line and may apply a read pass voltage to the unselected word-lines.

For example, the page buffer circuit 610 is coupled to the memory cell array 630 through the plurality of bit-lines BLs. The page buffer circuit 610 may include a plurality of page buffers. In exemplary embodiments of the present disclosure, one page buffer may be connected to one bit line. In other exemplary embodiments of the present disclosure, one page buffer may be connected to two or more bit lines.

The page buffer circuit 610 may temporarily store data to be programmed in a selected page or data read out from the selected page. The page buffer circuit 610 is controlled in response to a control signal PCTL received from the control circuit 650.

For example, the data input output circuit 620 is coupled to the page buffer circuit 610 through data lines DLs and is connected to a data I/O pin 680. During the program operation, the data input/output circuit 620 may receive multi-level data MLDAT. The data input/output circuit 620 may include a multi-level signal receiver according to example embodiments of the present disclosure, may decode the multi-level data MLDAT into a target data signal and may provide the target data signal to the page buffer circuit 610 based on the column address C_ADDR from the control circuit 650.

Hereinafter, example embodiments of the present disclosure will be described in detail based on various examples of the multi-level signaling scheme and various examples of the transmitter according to the multi-level signaling scheme. For instance, the multi-level signaling scheme according to one or more example embodiments of the present disclosure may be a Pulse-amplitude modulation (PAM) scheme.

Figure 6:
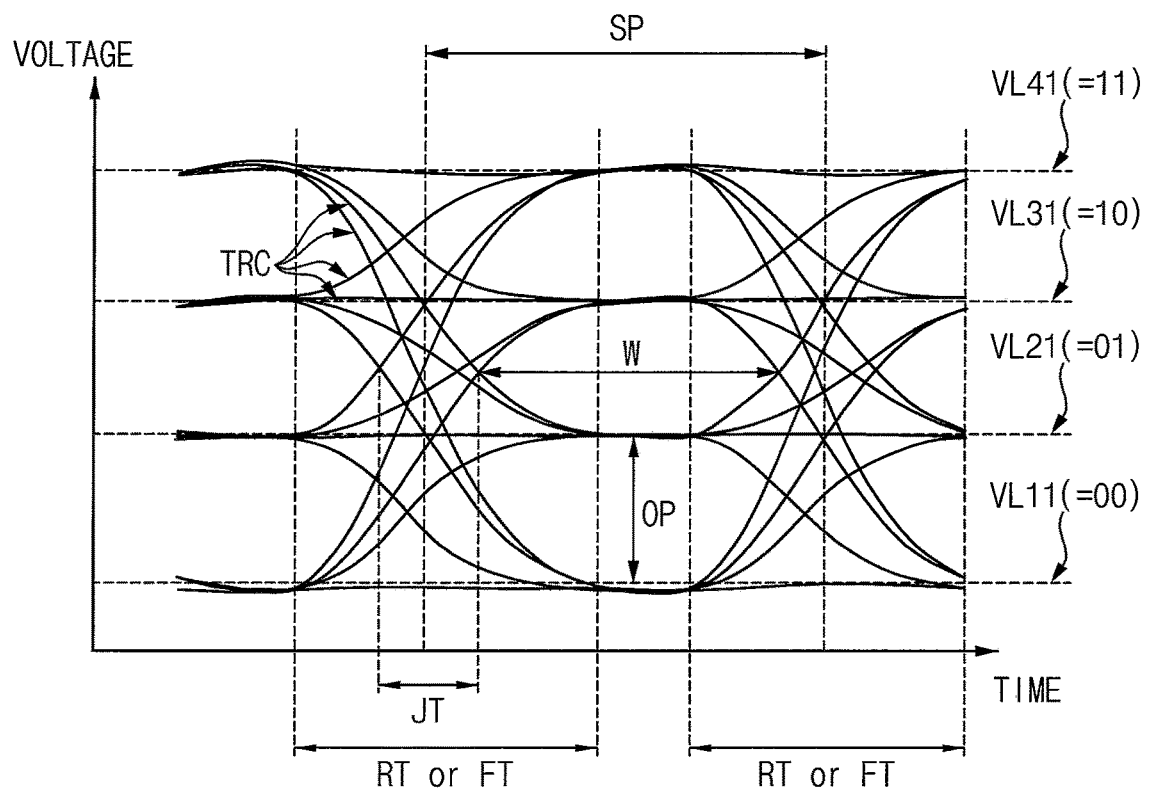
FIGS. 6 and 7 are diagrams for describing a data signal generated by a method of generating a multi level signal according to one or ore example embodiments of the present disclosure.
Figure 7:
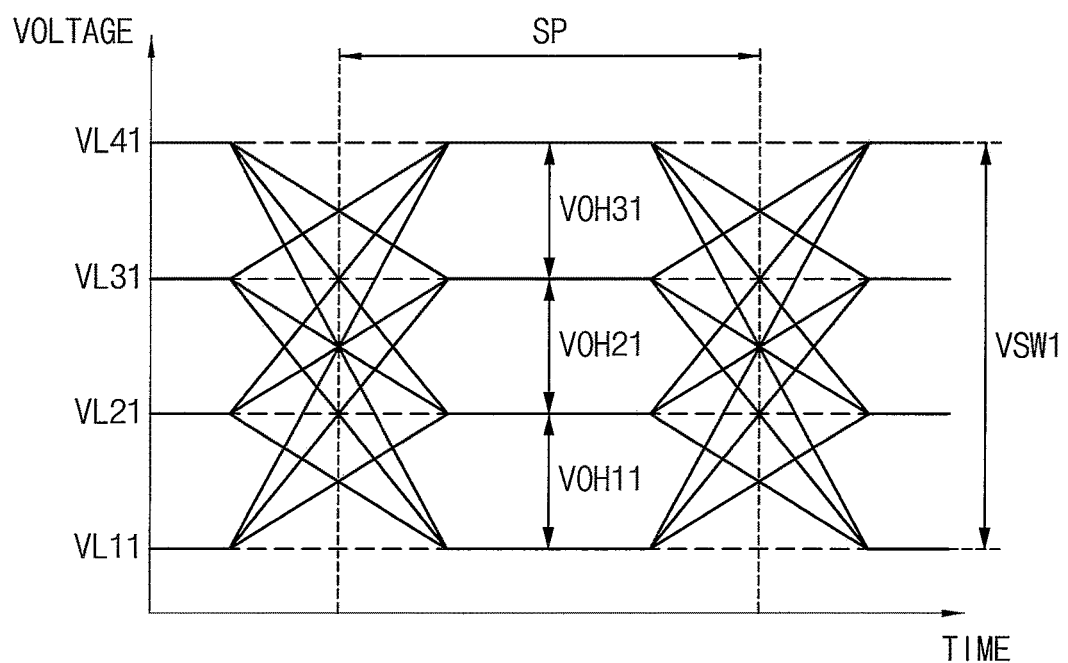

FIGS. 6 and 7 are diagrams for describing a data signal generated by a method of generating a multi-level signal according to one or more example embodiments of the present disclosure.

FIG. 6 illustrates an ideal eye diagram of a data signal generated based on a 4-level scheme. For example, FIG. 6 illustrates an ideal eye diagram of a four level pulse amplitude modulation (PAM-4) signal generated based on the fourth-level pulse amplitude modulation (PAM-4) signaling scheme FIG. 7 is a simplified diagram illustrating the eye diagram of FIG. 6.

Referring to FIG. 6, an eye diagram may be used to indicate the quality of signals in high-speed transmissions. For example, the eye diagram may represent four symbols of a signal (e.g., '00,' '01,' '10' and '11'), and each of the four symbols may be represented by a respective one of different voltage levels (e.g., voltage amplitudes) VL11, VL21, VL31 and VL41. For example, the voltage level VL11 may represent the signal '00'. The eye diagram may be used to provide a visual indication of the health of the signal integrity, and may indicate noise margins of the data signal.

To generate the eye diagram, an oscilloscope or other computing device may sample a digital signal according to a sample period SP (e.g., a unit interval or a bit period). The sample period SP may be defined by a clock associated with the transmission of the measured signal. The oscilloscope or other computing device may measure the voltage level of the signal during the sample period SIP to form the plurality of traces TRC. Various characteristics associated with the measured signal may be determined by overlaying the plurality of traces TRC.

The eye diagram may be used to identify a number of characteristics of a communication signal such as jitter, crosstalk, electromagnetic interference (EMI), signal loss, signal-to-noise ratio (SNR), other characteristics, or combinations thereof.

For example, a width W of an eye in the eye diagram may be used to indicate a timing synchronization of the measured signal or jitter effects of the measured signal. For example, the eye diagram may indicate an eye opening OP, which represents a peak-to-peak voltage difference between the various voltage levels VL11, VL12, VL13 and VL41. The eye opening OP may be related to a voltage margin for discriminating between different voltage levels VL11, VL21, VL31 and VL41 of the measured signal. The eye opening OP may correspond to the voltage interval described with reference to FIG. 1. For example, the eye diagram may be used to identify a rise time RT and/or a fall time FT for transitions from a first amplitude to a second amplitude. The rise time RT or the fall time FT may indicate a time required for transitioning from one voltage level to another voltage level, and may be related to or associated with a rising edge and a falling edge, respectively. The jitter JT may refer to a timing error which results from a misalignment of rise and fall times. The jitter JT may occur when the rising edge or the falling edge occurs at a time that is different from an ideal time defined by the data clock.

According to an example embodiment of the present disclosure, FIG. 7 illustrates different first, second, third and fourth voltage levels VL11, VL21, VL31 and VL41 of the data signal that is the PAM-4 signal, different first, second and third voltage intervals VOH11, VOH21 and VOH31 of the data signal, and a voltage swing width VSW1 of the data signal.

The first voltage level VL11 that is the lowest voltage level may be lower than the second voltage level VL21, the second voltage level VL21 may be lower than the third voltage level VL31, and the third voltage level VL31 may be lower than the fourth voltage level. VL41 that is the highest voltage level. In addition, the first voltage interval VOH11 may represent a difference between the first and second voltage levels VL11 and VL21, the second voltage interval VOH21 may represent a difference between the second and third voltage levels VL21 and VL31, the third voltage interval VOH31 may represent a difference between the third and fourth voltage levels VL31 and VL41, and the voltage swing width VSW1 may represent a difference between the first and fourth voltage levels VL11 and VL41.

Figure 8:
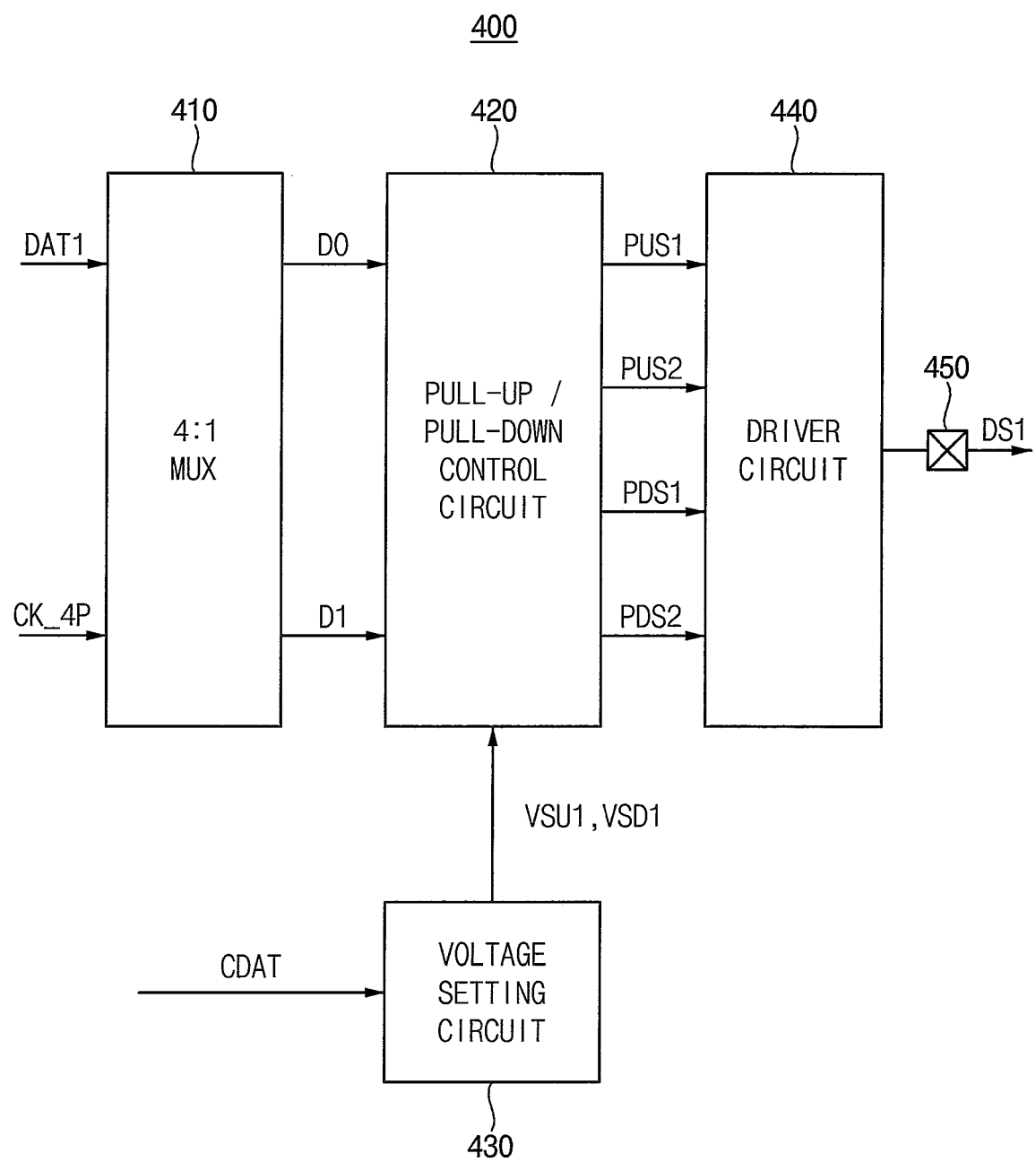
FIG. 8 is a block diagram illustrating a transmitter according to one or more example embodiments of the present disclosure.

FIG. 8 is a block diagram illustrating a transmitter according to one or more example embodiments of the present disclosure.

Referring to FIG. 8, a transmitter 400 includes a p own control circuit 420, a voltage setting circuit 430 and a driver circuit 440. The transmitter 400 may further include a multiplexer 410 and a data I/O pad 450.

The multiplexer 410 may receive input data DAT1 including two or more bits D0 and D1, and may divide the input data DAT1 into the two or more bits D0 and D1. The pull-up/pull-down control circuit 420 generates two or more pull-up control signals PUS1 and PUS2 and two or ore pull-down control signals PDS1 and PDS2 based on the input data DAT1 (e.g., the two or more bits D0 and D1) and voltage setting control signals VSU1 and VSD1. The voltage setting circuit 430 performs a voltage setting operation for voltage intervals of a multi-level signal and generates the voltage setting control signals VSU1 and VSD1 that represent a result of the voltage setting operation. The driver circuit 440 generates an output data signal DS1 that is the multi-level signal based on the two or more pull-up control signals PUS1 and PUS2 and the two or more pull-down control signals PDS1 and PDS2. The data I/O pad 450 may output the output data signal DS1.

The multi-level signal has one of M voltage levels. When the voltage setting operation is performed, M−1 voltage intervals each of which represents a difference between two adjacent voltage levels are different from each other.

Based on a characteristic data CDAT, the voltage setting circuit 430 may select at least one voltage level to be adjusted and may generate the voltage setting control signals VSU1 and VSD1. The characteristic data CDAT may represent a characteristic of a channel that transmits the output data signal DS1. For example, the characteristic data CDAT may represent a characteristic of one of the channels 31a to 31c shown in FIG. 2. The characteristic data CDAT may be generated based on a training operation on a multi-level signal receiver in the semiconductor memory device 200 and the semiconductor memory device 200 may transmit the characteristic data CDAT to the voltage setting circuit 430. In example embodiments of the present disclosure, an eye monitor circuit in the semiconductor memory device 200 may transmit the characteristic data CDAT to the voltage setting circuit 430 based on the training result.

In an example of FIG. 8, the input data DAT1 may include a first bit D0 and a second bit D1 that are different from each other, and the multiplexer 410 may divide the input data DAT1 into the first bit D0 and the second bit D1 based on a four-phase clock signal CK_4P. In some example embodiments of the present disclosure, the first bit D0 may be a least significant bit (LSB) of the input data DAT1, and the second bit D1 may be a most significant bit (MSB) of the input data DAT1.

Figure 9:
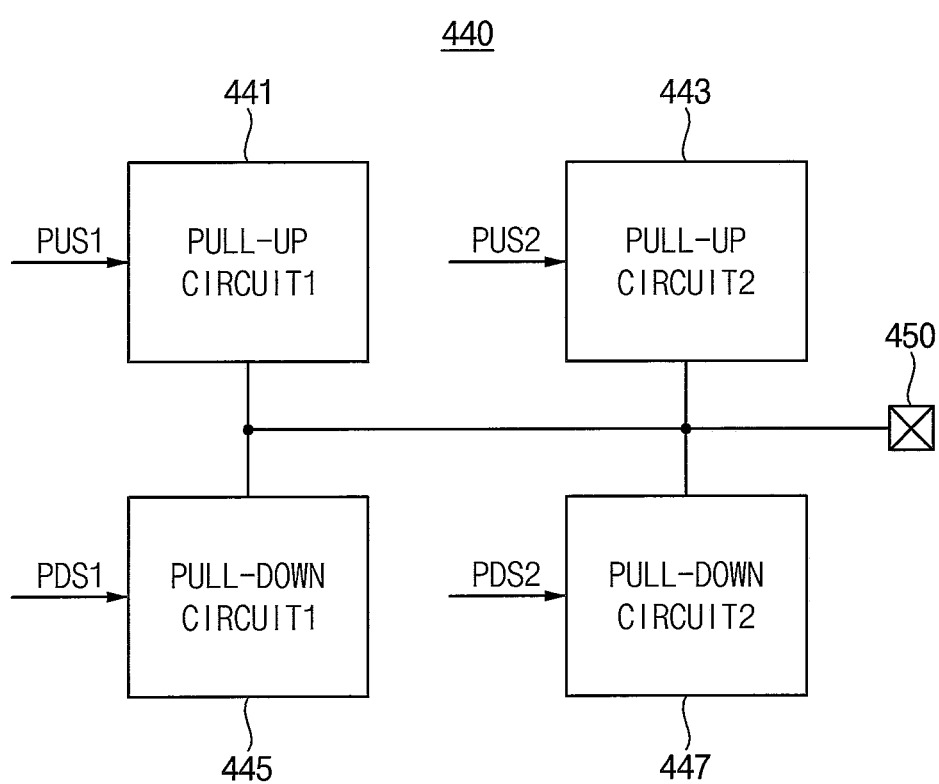
FIGS. 9 and 10 are diagrams illustrating a driver circuit included in a transmitter of FIG. 8 according to one or more example embodiments of the present disclosure.
Figure 10:
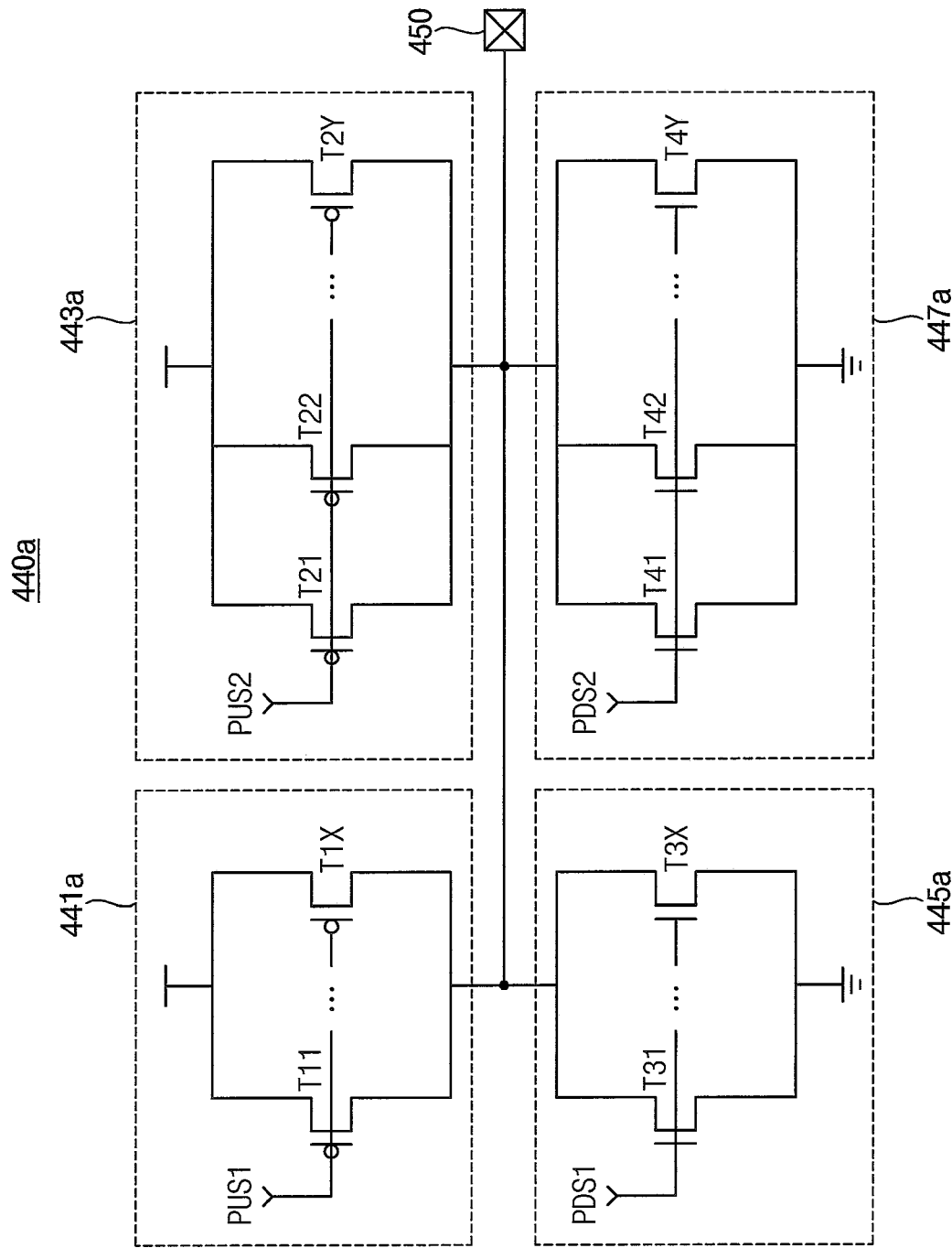

FIGS. 9 and 10 are diagrams illustrating a driver circuit included in a transmitter of FIG. 8 according to one or more example embodiments of the present disclosure.

Referring to FIG. 9, the driver circuit 440 may include a first pull-up circuit 441, a second pull-up circuit 443, a first pull-down circuit 445 and a second pull-down circuit 447.

The first pull-up circuit 441 may pull up the data I/O pad 450 based on the first pull-up control signal PUS1. The second pull-up circuit 443 may pull up the data I/O pad 450 based on the second pull-up control signal PUS2. The first pull-down circuit 445 may pull down the data I/O pad 450 based on the first pull-down control signal PDS1. The second pull-down circuit 447 may pull down the data I/O pad 450 based on the second pull-down control signal PDS2.

In addition, as shown by FIG. 10, a driver circuit 440a may include a first pull-up circuit 441a, a second pull-up circuit 443a, a first pull-down circuit 445a and a second pull-down circuit 447a.

The first pull-up circuit 441a may include a plurality of first pull-up transistors T11, . . . , T1X that are connected in parallel between a power supply: voltage and the data I/O pad 450. The plurality of first pull-up transistors T11, . . . , T1X may be selectively turned on based on the first pull-up control signal PUS1.

The second pull-up circuit 443a may include a plurality of second pull-up transistors T21, T22, . . . , T2Y that are connected in parallel between the power supply voltage and the data I/O pad 450. The plurality of second pull-up transistors T21, T22, . . . , T2Y may be selectively turned on based on the second pull-up control signal PUS2.

Thus, when it is required to pull up the output data signal DS1 to the second voltage level VL21, the first pull-up circuit 441a may be enabled or activated by turning on at least some of the plurality of first pull-up transistors T11, . . . , T1X based on the first pull-up control signal PUS1. In this case, the second voltage level VL21 may be adjusted by controlling the number (or quantity) of the plurality of first pull-up transistors T11, . . . , T1X that are turned on. For example, the second voltage level VL21 may increase as the number of the plurality of first pull-up transistors T11, . . . , T1X that are turned on increases. Similarly, when it is required to pull up the output data signal DS1 to the third voltage level VL31, the second pull-up circuit 443a may be enabled based on the second pull-up control signal PUS2, and the third voltage level VL31 may be adjusted by controlling the number of the plurality of second pull-up transistors T21, T22, . . . , T2Y that are turned on. In addition, when it is required to pull up the output data signal DS1 to the fourth voltage level VL41, both the first and second pull-up circuits 441a and 443a may be simultaneously enabled based on the first and second pull-up control signals PUS1 and PUS2, and the fourth voltage level VL41 may be adjusted by controlling the number of the plurality of first pull-up transistors T11, . . . , T1X and the plurality of second pull-up transistors T21, T22, . . . , T2Y that are turned on. When at least one of the second, third and fourth voltage levels VL21, VL31 and VL41 are adjusted as described above, the voltage intervals and the voltage swing width may be adjusted.

The first pull-down circuit 445a may include a plurality of first pull-down transistors T31, . . . , T3X that are connected in parallel between the data I/O pad 450 and a ground voltage. The plurality of first pull-down transistors T31, . . . , T3X may be selectively turned on based on the first pull-down control signal PDS1.

The second pull-down circuit 447a may include a plurality of second pull-down transistors T41, T42, . . . , T4Y that are connected in parallel between the data I/O pad 450 and the ground voltage. The plurality of second pull-down transistors T41, T42, ..., T4Y may be selectively turned on based on the second pull-down control signal PDS2.

Operations of the first and second pull-down circuits 445a and 447a may lie similar to the operations of the first and second pull-up circuits 441a and 443a.

Figure 11A:
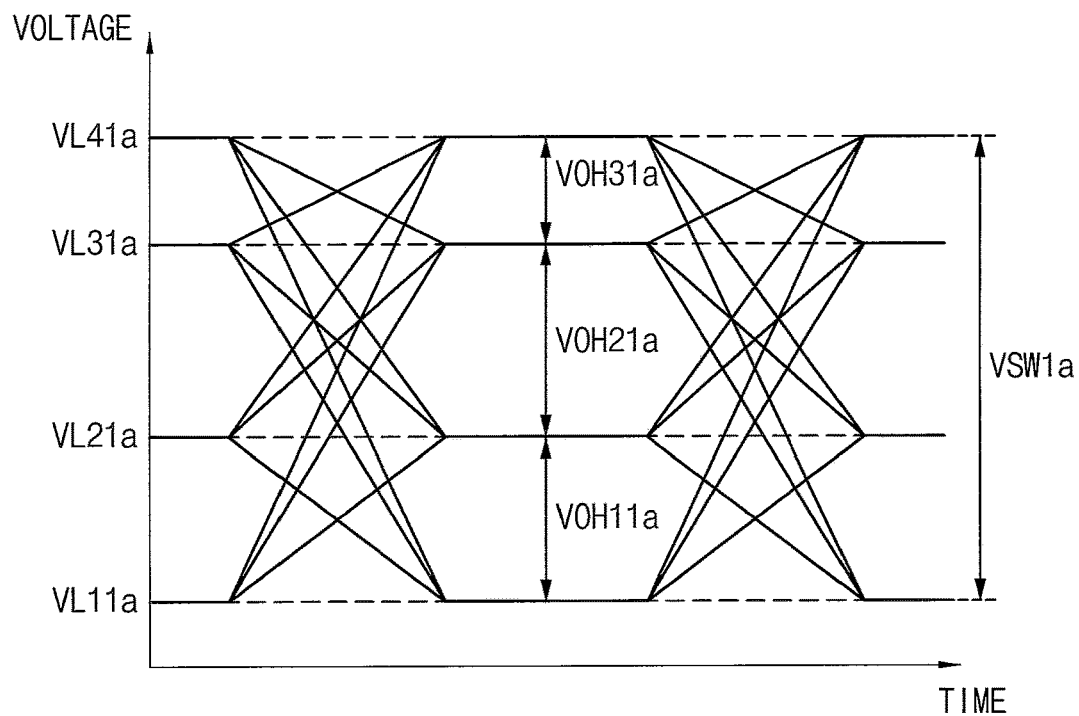
FIGS. 11A and 11B are diagrams for describing operations performed by a method of generating a multi-level signal and a transmitter according to one or more example embodiments of the present disclosure.
Figure 11B:
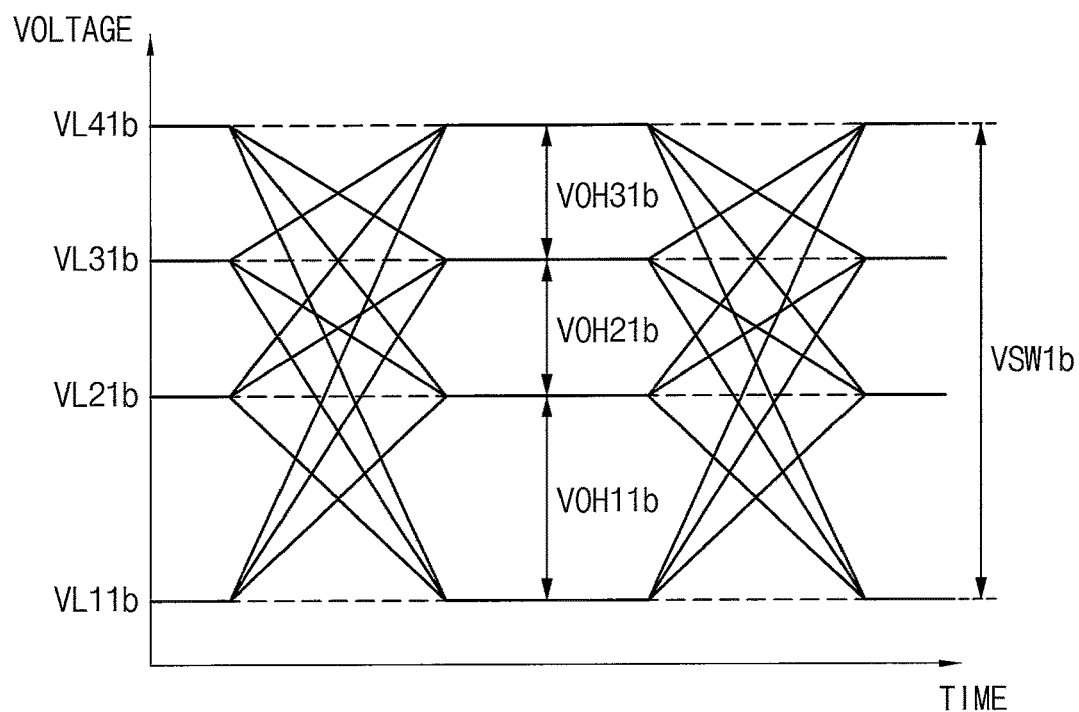

FIGS. 11A and 11B are diagrams for describing operations performed by a method of generating a multi-level signal and a transmitter according to one or more example embodiments of the present disclosure.

Referring to FIG. 11A, as the voltage interval adjustment and the voltage swing width adjustment are performed on the output data signal, voltage levels VL11a, VL21a, VL31a and VL41a may be adjusted, and voltage intervals VOH11a, VOH21a and VOH31a and a voltage swing width VSW1a may be changed. As compared with the example of FIG. 6, the first and second voltage intervals VOH11a and VOH21a and the voltage swing width VSW1a may increase in an example of FIG. 11A, and the third voltage interval VOH31a may decrease in the example of FIG. 11A. In addition, in the example of FIG. 11A, the first, second and third voltage intervals VOH11a, VOH21a and VOH31a may be different from each other. For example, the first voltage interval VOH11a may be less than the second voltage interval VOH21a and may be larger than the third voltage interval VOH31a.

Referring to FIG. 11B, as the voltage interval adjustment and the voltage swing width adjustment are performed on the output data signal, voltage levels VL11b, VL21b, VL31b and VL41b may be adjusted, and voltage intervals VOH11b, VOH21b and VOH31b and a voltage swing width VSW1b may be changed. As compared with the example of FIG. 7, the first voltage interval VOH11b and the voltage swing width VSW1b may increase as shown in FIG. 11B, and the second and third voltage intervals VOH21b and VOH31b may decrease as shown in FIG. 11B. In addition, in the example of FIG. 11B, the first voltage interval VOH11b may be larger than the second and third voltage intervals VOH21b and VOH31b, and the second and third voltage intervals VOH21b and VOH31b may be equal to each other.

Figure 12:
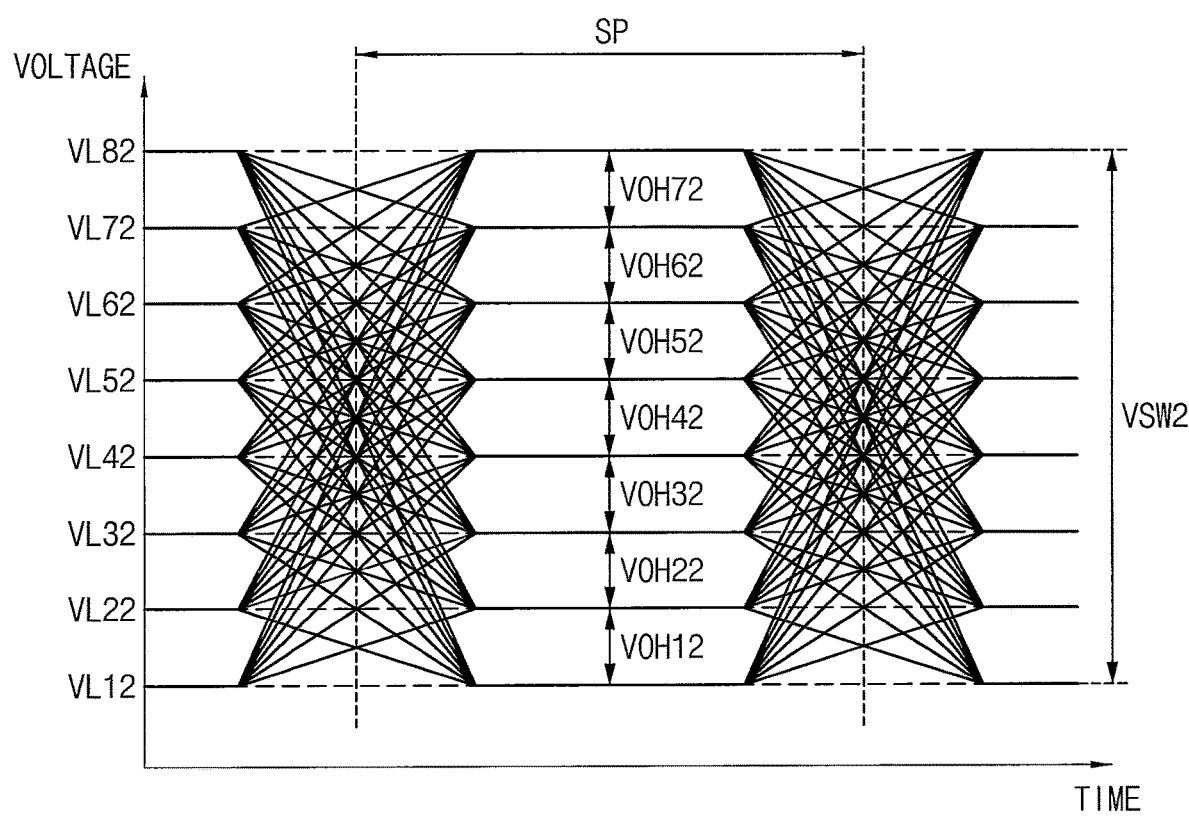
FIG. 12 is a diagram for describing a data signal generated bye a method of generating a multi-level signal according to one or more example embodiments of the present disclosure.

FIG. 12 is a diagram for describing a data signal generated by a method of generating a multi-level signal according to one or more example embodiments of the present disclosure. Descriptions overlapping with FIG. 7 will be omitted.

Referring to FIG. 12 is different first, second, third, fourth, fifth, sixth, seventh and eighth voltage levels VL12, VL22, VL32, VL42, VL52, VL62, VL72 and VL82 of a data signal (e.g., a PAM8 signal) that is generated based on the 8-level scheme (e.g., the PAM8 scheme) are illustrated, (ii) different first, second, third, fourth, fifth, sixth and seventh voltage intervals VOH12, VOH22, VOH32, VOH42, VOH52, VOH62 and VOH72 of the data signal are illustrated, and (iii) a voltage swing width VSW2 of the data signal is illustrated. As described above, the selective level change for adjusting the voltage intervals and/or the voltage swing width may be performed.

Figure 13:
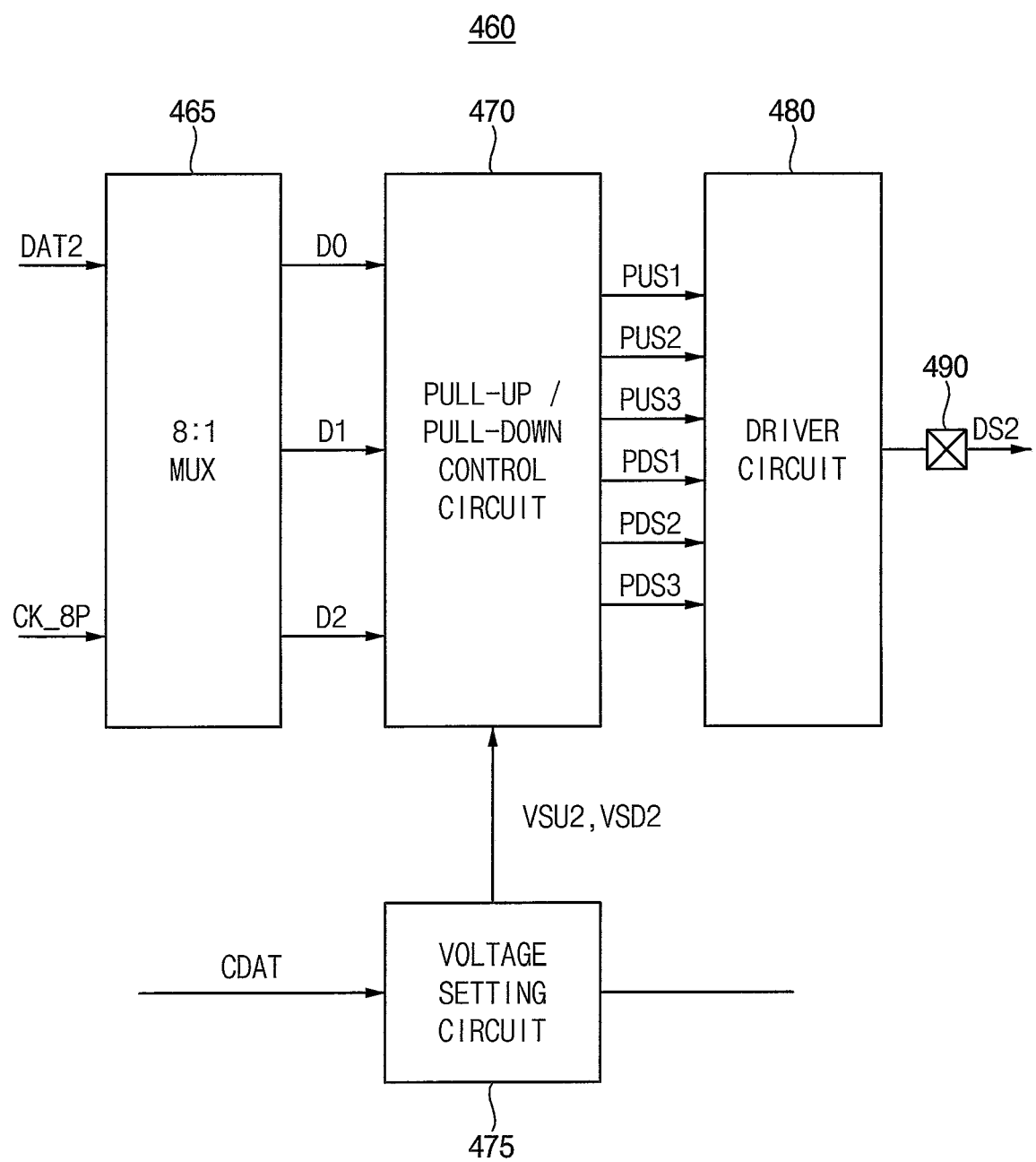
FIG. 13 is a block diagram illustrating a transmitter according to one or more example embodiments of the present disclosure.

FIG. 13 is a block diagram illustrating a transmitter according to one or more example embodiments of the present disclosure. Descriptions for elements described with FIG. 8 will be omitted.

Referring to FIG. 13, a transmitter 460 includes a pull-up/pull-down control circuit 470, a voltage setting circuit 475 and a driver circuit 480. The transmitter 460 may further include a multiplexer 465 and a data I/O pad 490, as shown.

In FIG. 13 input data DAT2 may include a first bit D0, a second bit D1 and a third bit D2 that are different from each other, and the multiplexer 465 may divide the input data DAT2 into the first, second and third bits D0, D1 and 02 based on an eight-phase clock signal CK_8P. An output data signal DS2 may correspond to the data signal illustrated in FIG. 12, and may have one of the first, second, third, fourth, fifth, sixth, seventh and eighth voltage levels VL12, V22, VL32, VL42, VL52, VL62, VL72 and VL82, that are different from each other, during one unit interval. The voltage setting operation may be performed by adjusting at least one of the first, second, third, fourth, fifth, sixth, seventh and eighth voltage levels VL12, VL22, VL32, VL42, VL52, VL62, VL72 and VL82.

In some example embodiments of the present disclosure, the first bit D0 may be a LSB of the input data DAT2, the second bit D1 may be a central significant bit (CSB) of the input data DAT2, and the third hit D2 may be an MSB of the input data DAT2. Based on the characteristic data CDAT, the voltage setting circuit 475 may generate the voltage setting control signals VSU2 and VSD2. The pull-up/pull-down control circuit 470 may generate pull-up control, signals PUS1, PSU2 and PUS3 and pull-down control signals PDS1, PDS2 and PDS3 and may provide the pull-up control signals PUS1, PSU2 and PUS3 and pull-down control signals PDS1, PDS2 and PDS3 to the driver circuit 480.

Figure 14:
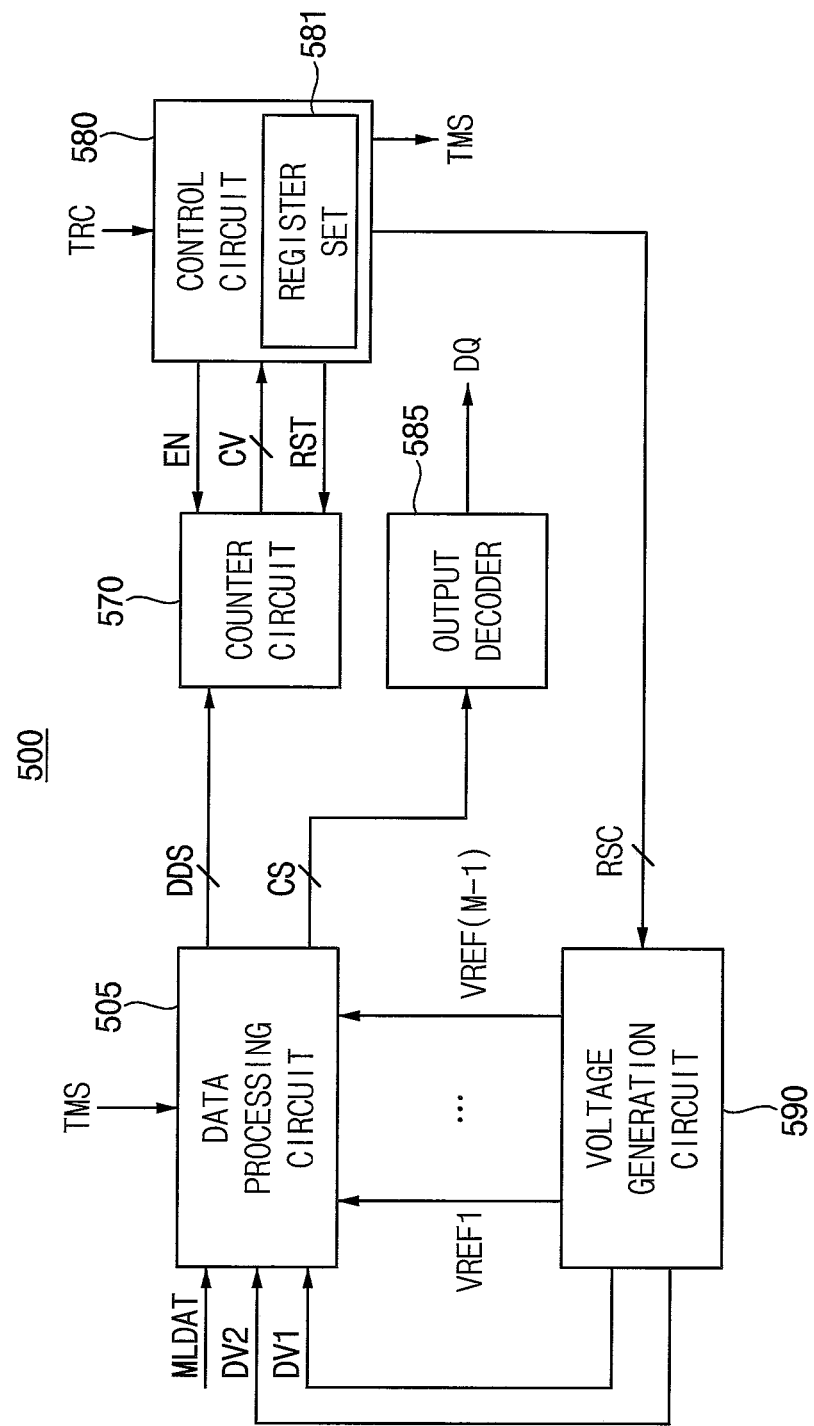
FIG. 14 is a block diagram illustrating a receiver according to one or more example embodiments of the present disclosure.

FIG. 14 is a block diagram illustrating a receiver according to one or more example embodiments of the present disclosure.

Referring to FIG. 14, a receiver 500 may include a data processing circuit 505, a counter circuit 570, a control circuit 580, an output decoder 585 and a voltage generation circuit 590.

The data processing circuit 505 receives the multi-level signal MLDAT. The data processing circuit 505, in a training mode, may consecutively compare the multi-level signal MLDAT with a first voltage signal DV1 and a second voltage signal DV2 having a first difference from the first voltage DV1, may generate data density signals DDS indicating a number of symbols associated with the multi-level signal MLDAT distributed between the first voltage signal DV1 and the second voltage signal DV2, and may provide the data density signals DDS to the counter circuit 570 based on a training mode signal TMS. The data processing circuit 505, in a normal mode, may compare the multi-level signal MLDAT with (M−1) reference voltages VREF1~VREF(M−1) to generate a plurality of comparison signals CS and may provide the plurality of comparison signals CS to the output decoder 585 based on the training mode signal TMS.

The counter circuit 570 may perform a counting operation on the data density signals DDS to generate counting, values CV and may provide the counting values CV to the control circuit 580.

The control circuit 580 may include a register set 581 therein, and may store, in the register set 581, a voltage range based on the first voltage signal DV1 and the second voltage signal DV2, counting values corresponding to the voltage range and a control code RCS associated with a first level of the first voltage signal DV1 and a second level of the second voltage signal DV2 by accumulating the voltage range, the counting value and the control code RCS. The control circuit 580 may perform a reference voltage training to select a control code associated with a reference voltage provided to the data processing circuit 505 in the normal mode, based on the counting values stored in the register set 581. The reference voltage training may correspond to a blind training in which an optimal level of a reference voltage is searched without original data. In other words, the re ferule e voltage training may be referred to as blind reference voltage training. The voltage range may be referred to as a voltage interval.

The voltage generation circuit 590, in the training mode, may apply the first voltage signal DV1 and the second voltage signal DV2 to the data processing circuit 505 and may increase the first level of the first voltage signal and the second level of the second voltage signal DV2 by the first difference step-wisely in response to the control code RCS from the control circuit 580.

The control circuit 580 may provide the voltage generation circuit 590 with a control code associated with a minimum voltage range corresponding to a minimum counting value among the counting values CV stored in the register set 581, as a selected control code, and the voltage generation circuit 590 may apply at least one reference voltage VREF1~VREF(M−1) to the data processing circuit 505 in response to the selected control code in the normal mode.

In addition, the control circuit 580 may provide the data processing circuit 505 with the training mode signal TMS designating the reference voltage training in response to a training command TRC from the memory controller 100. The control circuit 580 may maintain the training mode signal TMS with a logic high level while the control circuit 580 is performing the reference voltage training.

The control circuit 580 may apply, to the counter circuit 570, an enable signal EN associated with activating the counter circuit 570 and a reset signal RST associated with resetting the counter circuit 570. The training command TRC may designate the start and end of the reference voltage training. In example embodiments of the present disclosure, the memory controller 100 may apply a training start command and training end command to the control circuit 580 instead of the training command TRC.

The output decoder 585 may determine data bits corresponding to the multi-level signal MLDAT based on levels of the plurality of comparison signals CS and may output a target data signal DQ indicating the determined data bits. The target data signal DQ may include N bits and N may be an integer equal to or greater than two, FIG. 15 is a circuit diagram illustrating the receiver of FIG. 14 according to one or more example embodiments of the present disclosure.

Figure 15:
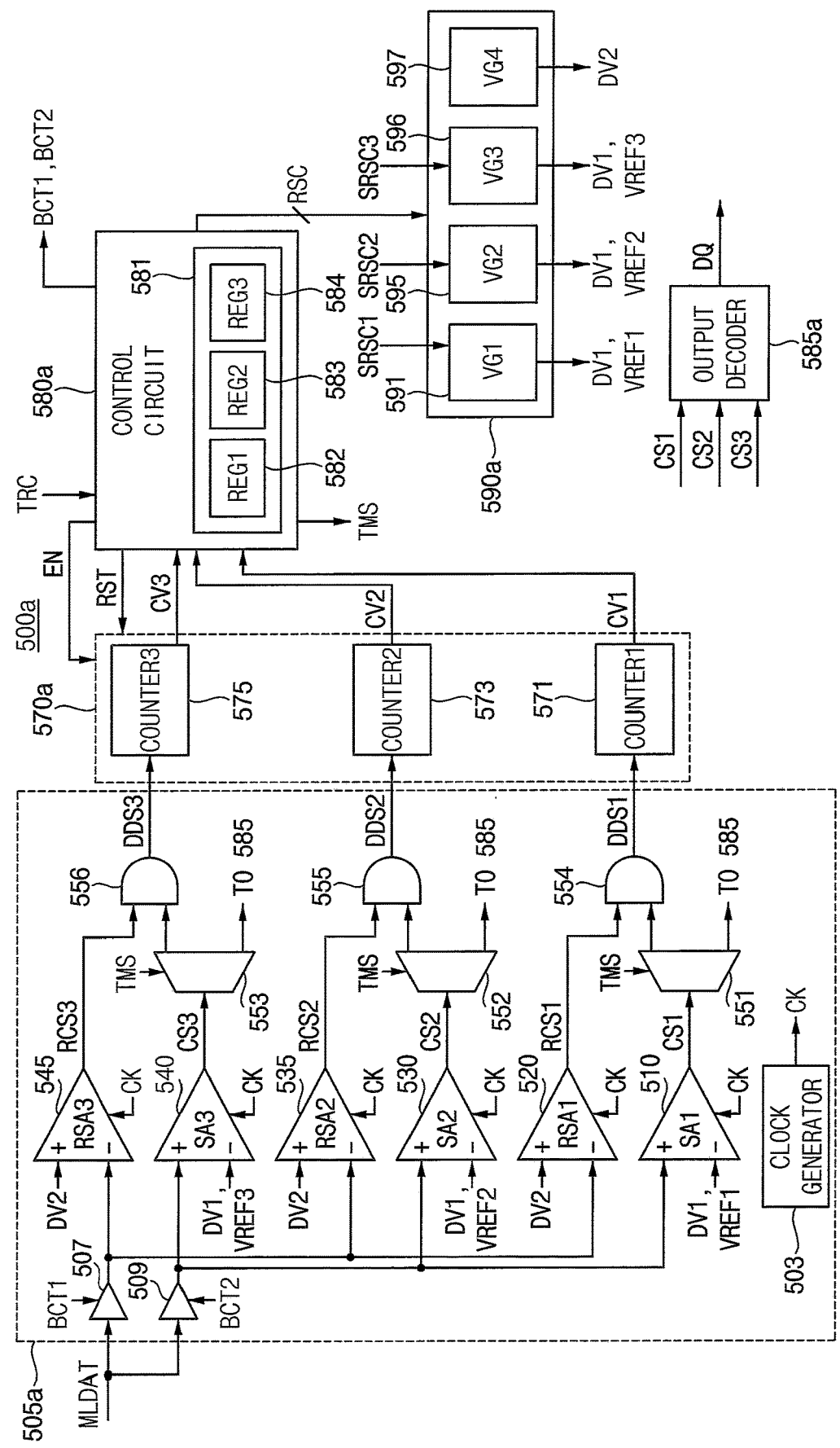
FIG. 15 is a circuit diagram illustrating the receiver of FIG. 14 according to one or more example embodiments of the present disclosure.

In FIG. 15, it is assumed that M is four.

Referring to FIG. 15, a receiver 500a may include a data processing circuit 505a, a counter circuit 570a, a control circuit 580a, an output decoder 585a and a voltage generation circuit 590a.

The data processing circuit 505a may include a first buffer 507, a second buffer 509, first, second and third sense amplifiers 510, 530 and 540, first, second and third replica sense amplifiers 520, 535 and 545, first, second and third demultiplexers 551, 552 and 553, first, second and third AND gates 554, 555 and 556 and a clock generator 503. The clock generator 503 may generate a clock signal CK and may provide the clock signal CK to the first through third sense amplifiers 510, 530 and 540 and the first through third replica sense amplifiers 520, 535 and 545.

The first buffer 507 is activated in the training mode in response to a first buffer control signal BCT1, buffers the multi-level signal MLDAT and provides the multi-level signal MLDAT to the first through third replica sense amplifiers 520, 535 and 545. The second buffer 509 is activated in the training mode and the normal mode in response to a second buffer control signal BCT2, buffers the multi-level signal MLDAT and provides the multi-level signal MLDAT to the first through third sense amplifiers 510, 530 and 540. The first buffer 507 may reduce loading of the first through third replica sense amplifiers 520, 535 and 545 and the second buffer 509 may reduce loading of the first through third sense amplifiers 510, 530 and 540.

Each of the first through third sense amplifiers 510, 530 and 540 may output a respective one of first, second and third comparison signals CS1, CS2 and CS3 by comparing the multi-level signal MLDAT with the first voltage signal DV1 in the training mode and by comparing the multi-level signal MLDAT with a respective one of first, second and third reference voltages VREF1, VREF2 and VREF3 in the normal mode, in response to the clock signal CK. Each of the first through third sense amplifiers 510, 530 and 540 may have a positive input terminal to receive the multi-level signal MLDAT and a negative input terminal to receive the first voltage signal DV1. The first through third reference voltages VREF1, VREF2, and VREF3 may be applied to the negative input terminal of the first through third sense amplifiers 510, 530 and 540, respectively.

Each of the first through third replica sense amplifiers 520, 535 and 545 may output a respective one of first, second and third replica comparison signals RCS1, RCS2 and RCS3 by comparing the multi-level signal MLDAT with the second voltage signal DV2 in the training mode. Each of the first through third replica sense amplifiers 520, 535 and 545 may have a positive input terminal to receive the second voltage signal DV2 and a negative input terminal to receive the multi-level signal MLDAT.

Each of the first through third demultiplexers 551, 552 and 553, in response to the training mode signal TMS, may provide a respective one of the first through third comparison signals CS1, CS2 and CS3 to a respective one of the first through third AND gates 554, 555 and 556 in the training mode and may provide a respective one of the first through third comparison signals CS1, CS2 and CS3 to the output decoder 585a in the normal mode.

Each of the first through third AND gates 554, 555 and 556 may perform an AND operation on a respective one of the first through third comparison signals CS1, CS2 and CS3 and a respective one of the first through third replica comparison signals RCS1, RCS2 and RCS3 to generate a respective one of first, second and third data density signals DDS1, DDS2 and DDS3, in the training mode and may provide the first through third data density signals DDS1, DDS2 and DDS3 to the counter circuit 570a, Since the first through third AND gates 554, 555 and 556 may provide the first through third data density signals DDS1, DDS2 and DDS3 to the counter circuit 570a during a determined time interval, each of the first through third data density signals DDS1, DDS2 and DDS3 may indicate a number of symbols associated with the multi-level signal MLDAT distributed between the first level of the first voltage signal DV1 and the second level of the second voltage signal DV2. Each of the symbols may correspond to one of a plurality of groups indicated by a plurality of data bits of the multi-level signal MLDAT.

The counter circuit 570a may include first through third counters 571, 573 and 575. Each of the first through third counters 571, 573 and 575 may be activated in response to the enable signal EN, may perform a counting operation on a respective one of the first through third data density signals DDS1, DDS2 and DDS3 until the first through third counters 571, 573 and 575 are reset in response to the reset signal RST and may provide a respective one of first, second and third counting values CV1, CV2 and CV3 to the control circuit 580a.

The control circuit 580 may include the register set 581 and the register set 581 may include first, second and third registers 582, 583 and 584.

The first register 582 may store the first counting value CV1, a first voltage range associated with the first counting value CV1 and a control code associated with the first voltage range fey accumulating the first counting value CV1, the first voltage range and the control code. The second register 583 may store the second counting value CV2, a second voltage range associated with the second counting value CV2 and a control code associated with the second voltage range by accumulating the second counting value CV2, the second voltage range and the control code. The third register 584 may store the third counting value CV3, a third voltage range associated with the third counting value CV3 and a control code associated with the third voltage range by accumulating the third counting value CV3, the third voltage range and the control code.

The voltage generation circuit 590a may include first, second, third and fourth voltage generators 591, 595, 596 and 597. Each of the first through third voltage generators 591, 595 and 596 may generate the first voltage signal DV1 in response to a control code and provide the first voltage signal DV1 to a respective one of the first through third sense amplifiers 510, 530 and 540 in the training mode. The fourth voltage generator 597 may generate the second voltage signal DV2 in response to a voltage control code and may provide the second voltage signal DV2 to the first through third replica sense amplifiers 520, 535 and 545 in the training mode.

The control circuit 580a may provide the first voltage generator 591 with a first control code associated with a first minimum counting value among the first counting values CV1 stored in the first register 582, as a first selected control code SRSC1 and the first voltage generator 591 may generate the first reference voltage VREF1 in response to the first selected control code SRSC1 in the normal mode.

The control circuit 580a may provide the second voltage generator 595 with a second control code associated with a second minimum counting value among the second counting values CV2 stored in the second register 583, as a second selected control code SRSC2 and the second voltage generator 595 may generate the second reference voltage VREF2 in response to the second selected control code SRSC2 in the normal mode.

The control circuit 580a may provide the third voltage generator 596 with a third control code associated with a third minimum counting value among the third counting values CV3 stored in the third register 584, as a third selected control code SRSC3 and the second voltage generator 595 may generate the third reference voltage VREF3 in response to the third selected control code SRSC3 in the normal mode.

The output decoder 585a may determine data bits corresponding to the multi-level signal MLDAT based on logic levels of the first through third comparison signals CS1, CS2 and CS3 and may output the target data signal DQ indicating the determined data bits.

The control circuit 580 may perform the reference voltage training on the first through third sense amplifiers 510, 530 and 540 concurrently. The receivers 47a, 47b and 47c connected to the data I/O pads 49a, 49b and 49c in the semiconductor memory device 201 may perform the reference voltage training concurrently.

The control circuit 580a may generate the first buffer control signal BCT1 and the second buffer control signal BTC2 in response to the training command RC and may provide the first buffer control signal BCT1 and the second buffer control signal BTC2 to the first buffer 507 and the second buffer 509, respectively.

Figure 16:
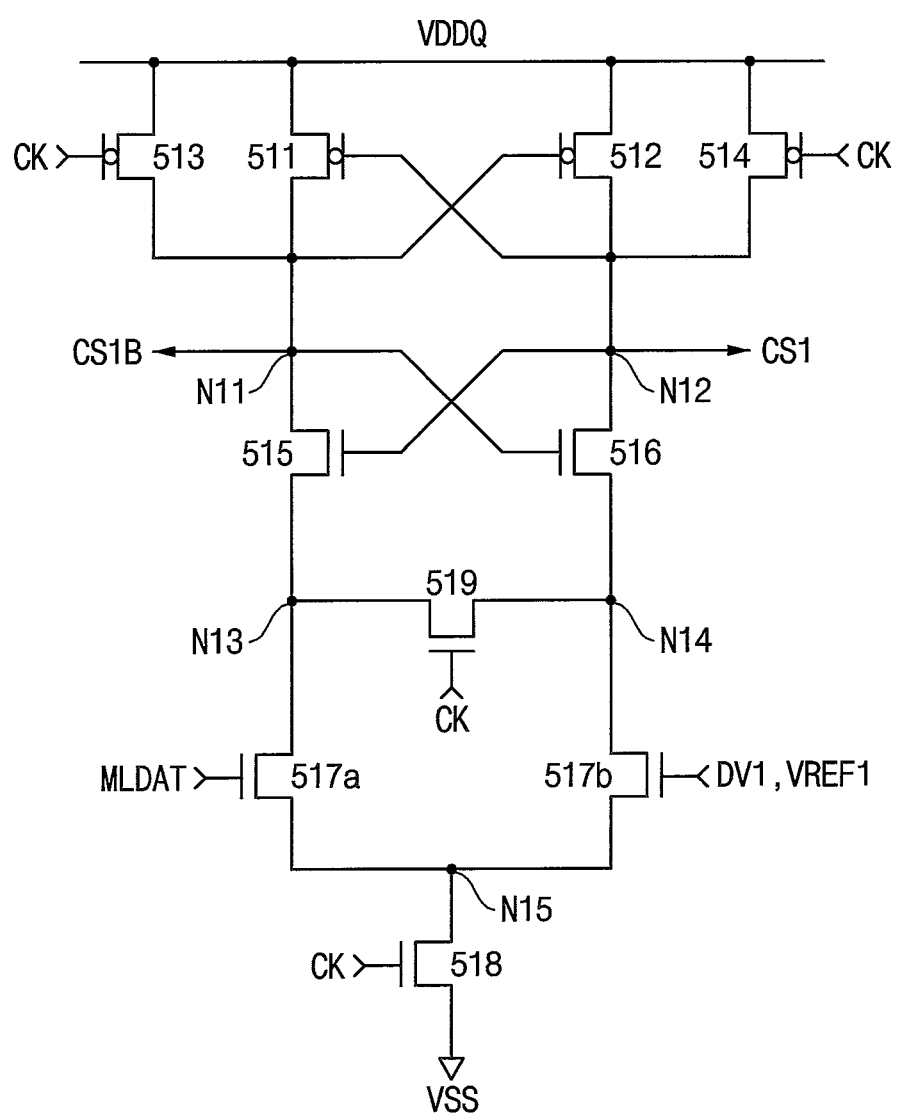
FIG. 16 is a circuit diagram illustrating the first sense amplifier in the receiver of FIG. 15 according to one or more example embodiments of the present disclosure.

FIG. 16 is a circuit diagram illustrating the first sense amplifier in the receiver of FIG. 15 according to one or more example embodiments of the present disclosure.

Referring to FIG. 16, the first sense amplifier 510 may include first, second, third and fourth p-channel metal-oxide semiconductor (PMOS) transistors 511, 512, 513 and 514 and first, second, third, fourth, fifth and sixth n-channel metal-oxide semiconductor (NMOS) transistors 515, 516, 517a, 517b, 518 and 519.

The first PMOS transistor 511 is connected between a power supply voltage VDDQ and a first node N11, and a gate of the first PMOS transistors 511 is connected to a second node N12. The second. PMOS transistor 512 is connected between the power supply voltage VDDQ and the second node N12, and a gate of the second PMOS transistor 512 is connected to the first node N11. The third PMOS transistor 513 is connected between the power supply voltage VDDQ and the first node N11 in parallel with the first PMOS transistor 511, and a gate of the third PMOS transistors 513 receives the clock signal CK. The fourth PMOS transistor 514 is connected between the power supply voltage VDDQ and the second node N12 in parallel with the second PMOS transistor 512 and a gate of the fourth PMOS transistor 514 receives the clock signal CK.

The first NMOS transistor 315 is connected between the first node N11 and a third node N13, and a gate of the first NMOS transistor 515 is connected to the second node N12. The second NMOS transistor 516 is connected between the second node N12 and a fourth node N14, and a gate of the second NMOS transistor 516 is connected to the first node N11. The sixth NMOS transistor 519 is connected between the third node N13 and the fourth node N14 and a gate of the sixth NMOS transistor 519 receives the clock signal CK.

The third NMOS transistor 517a is connected between the third node N13 and a fifth node N15, and a gate of the third NMOS transistor 517a receives the multi-level signal MLDAT. The fourth NMOS transistor 517b is connected between the fourth node N14 and the fifth node N15, and a gate of the fourth NMOS transistor 517b receives the first voltage signal DV1 in the training mode and receives the first reference voltage VREF1 in the normal mode. The fifth NMOS transistor 518 is connected between the fifth node N15 and a ground voltage VSS, and a gate of the fifth NMOS transistor 518 receives the clock signal CK.

In example embodiments of the present disclosure, the sixth NMOS transistor 519 may not be included in the first sense amplifier 510.

In a first phase in which the clock signal CK has a low level, the third PMOS transistor 513 and the fourth PMOS transistor 514 are turned on, and the first node N11 and the second node N12 are precharged with the power supply voltage VDDQ. The first NMOS transistor 515 and the second NMOS transistor 516 are turned on in response to the power supply voltage VDDQ at the first node N11 and the second node N12. Accordingly, the third node N13 and the fourth node N14 are precharged with the power supply voltage VDDQ. When one of the third NMOS transistor 517a and the fourth NMOS transistors 517b is turned on, the fifth node N15 is precharged with a level corresponding to the power supply voltage VDDQ minus threshold voltage of each of the third NMOS transistor 517a and the fourth NMOS transistors 517b.

In a second phase in which the clock signal CK has a high level, the third PMOS transistor 513 and the fourth PMOS transistor 514 are turned off, and each of the third NMOS transistor 517a and the fourth NMOS transistors 517b draws a current proportional to a voltage applied to its gate.

When the multi-level signal MLDAT is greater than the first voltage signal DV1, a current which the third NMOS transistor 517a draws is greater than a current which the fourth NMOS transistor 517b draws, and thus, the voltage at the first node N11 is discharged through the first NMOS transistor 515, the third NMOS transistor 517a and the fifth NMOS transistor 518. When the multi-level signal MLDAT is smaller than the first voltage signal DV1, a current which the fourth NMOS transistor 517b draws is greater than a current which the third NMOS transistor 517a draws, and thus, a voltage at the second node N12 is discharged through the second NMOS transistor 516 the fourth NMOS transistor 517b and the fifth NMOS transistor 518.

Therefore, the first sense amplifier 510 may compare the multi-level signal MLDAT with the first voltage signal DV1 or the first reference voltage VREF1, may output the first comparison signal CS1 at the second node N12 and may output a first inverted comparison single CS1B at the first node N11.

Each of the second sense amplifier 530 and the third sense amplifier 540 may have same configuration of the first sense amplifier 510 of FIG. 16.

Figure 17:
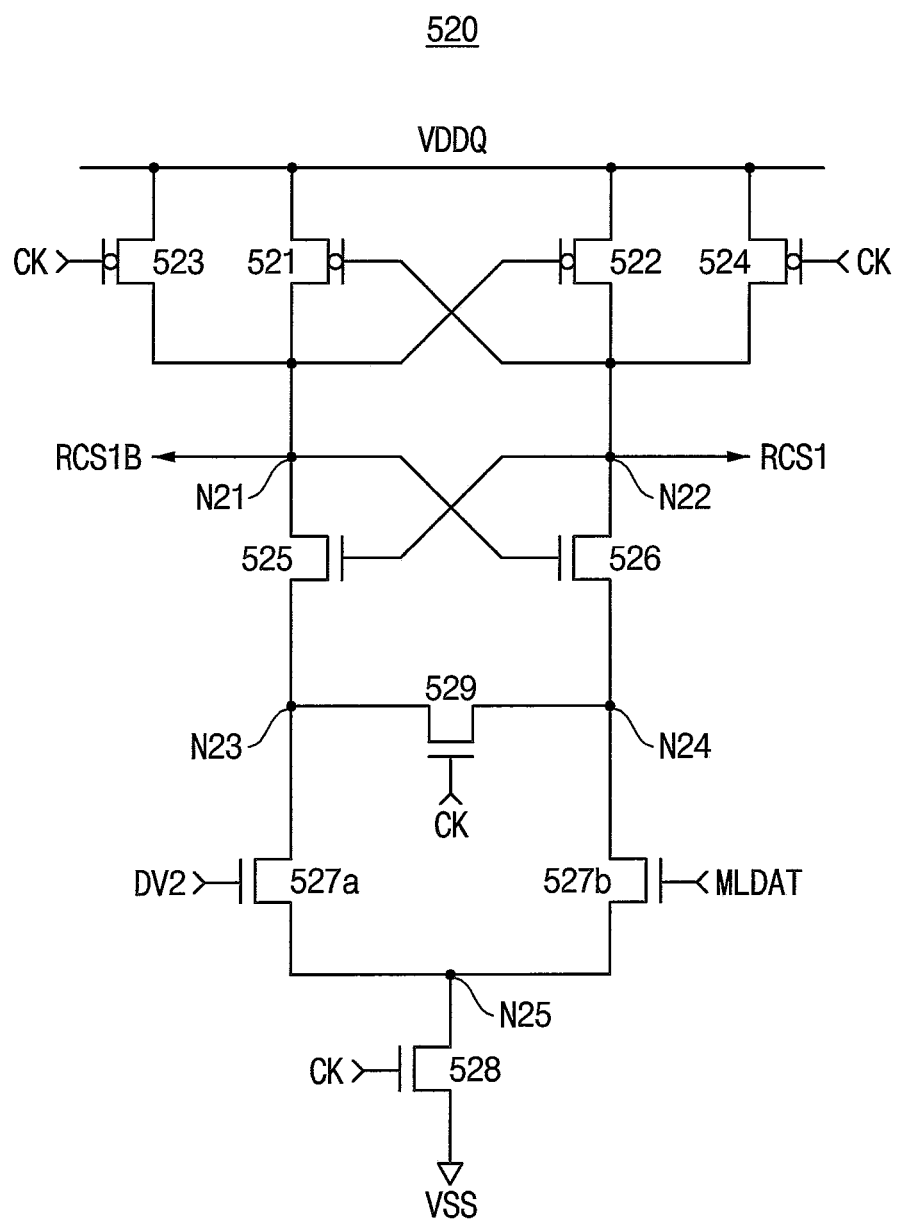
FIG. 17 is a circuit diagram illustrating the first replica sense amplifier in the receiver of FIG. 15 according to one or more example embodiments of the present disclosure.

FIG. 17 is a circuit diagram illustrating the first replica sense amplifier in the receiver of FIG. 15 according to one or more example embodiments of the present disclosure.

Referring to FIG. 17, the first replica sense amplifier 520 may include first, second, third and fourth PMOS transistors 521, 522, 523 and 524 and first, second, third, fourth, fifth and sixth NMOS transistors 525, 526, 527a, 527b, 528 and 529.

The first PMOS transistor 521 is connected between the power supply voltage VDDQ and a first node N21, and a gate of the first PMOS transistors 521 is connected to a second node N22. The second PMOS transistor 522 is connected between the power supply voltage VDDQ and the second node N22, and a gate of the second PMOS transistor 522 is connected to the first node N21. The third PMOS transistor 523 is connected between the power supply voltage VDDQ and the first node N21 in parallel with the first PMOS transistor 521, and a gate of the third PMOS transistors 523 receives the clock signal CK. The fourth PMOS transistor 524 is connected between the power supply voltage VDDQ and the second node N22 in parallel with the second PMOS transistor 522 and a gate of the fourth PMOS transistor 524 receives the clock signal CK.

The first NMOS transistor 525 is connected between the first node N21 and a third node N23, and a gate of the first NMOS transistor 525 is connected to the second node N22. The second NMOS transistor 526 is connected between the second node N22 and a fourth node N24, and a gate of the second NMOS transistor 526 is connected to the first node N21. The sixth NMOS transistor 529 is connected between the third node N23 and the fourth node N24 and a gate of the sixth NMOS transistor 529 receives the clock signal CK.

The third NMOS transistor 527a is connected between the third node N23 and a fifth node N25, and a gate of the third NMOS transistor 527a receives the second voltage signal DV2. The fourth NMOS transistor 527b is connected between the fourth node N24 and the fifth node N25, and a gate of the fourth NMOS transistor 527b receives the multi-level signal MLDAT. The fifth NMOS transistor 528 is connected between the fifth node N25 and the ground voltage VSS, and a gate of the fifth NMOS transistor 528 receives the clock signal CK.

The first replica sense amplifier 520 may operate similarly to the first sense amplifier 510 of FIG. 16. Therefore, the first replica sense amplifier 520 may compare the multi-level signal MLDAT with the second voltage signal DV2, may output the first replica comparison signal RCS1 at the second node N22 and may output a first inverted replica comparison signal RCS1B at the first node N21.

Figure 18:
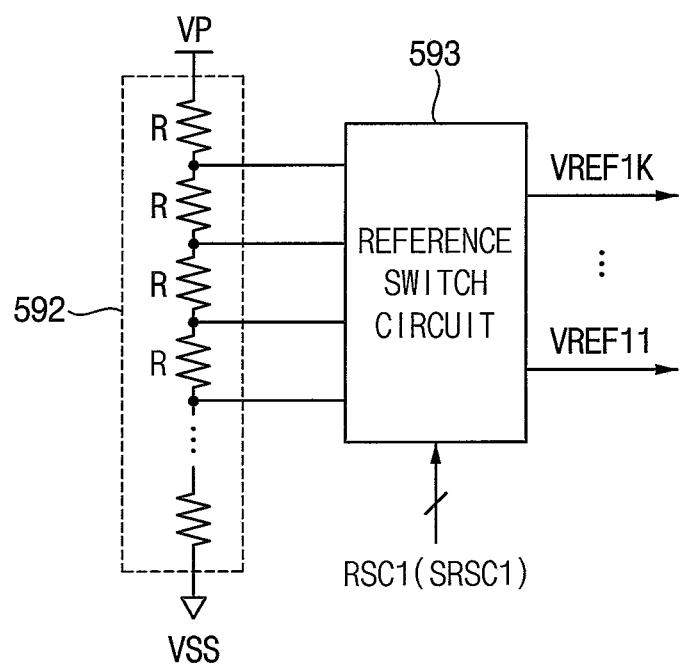
FIG. 18 is a block diagram illustrating the first voltage generator in the receiver of FIG. 15 according to one or more example embodiments of the present disclosure.

FIG. 18 is a block diagram illustrating the first voltage generator in the receiver of FIG. 15 according to one or more example embodiments of the present disclosure.

Each configuration of the second through fourth voltage generators 594, 595 and 596 may be substantially the same as a configuration of the first voltage generator 591 of FIG. 18.

Referring to FIG. 18, the first voltage generator 591 may include a voltage division circuit 592 and a reference switch circuit 593.

The voltage division circuit 592 may include a plurality of resistors R connected in series between power supply voltage VDDQ and the ground voltage VSS. The reference switch circuit 593 may switch between the plurality of resistors R in response to a first control code RCS1 in the training mode to output the R reference voltages VREF11~VREF1K. The reference switch circuit 593 may include a plurality of switches connected between the plurality of resistors R. Here, K is an integer equal to or greater than two. The reference switch circuit 593 may sequentially output the K reference voltages VREF11~VREF1K in response to the first control code RCS1 in the training mode.

The reference switch circuit 593 may output one of the K reference voltages VREF11~VREF1K as the first reference voltage VREF1 in response to the first selected control code SRCS1 in the normal mode.

Figure 19:
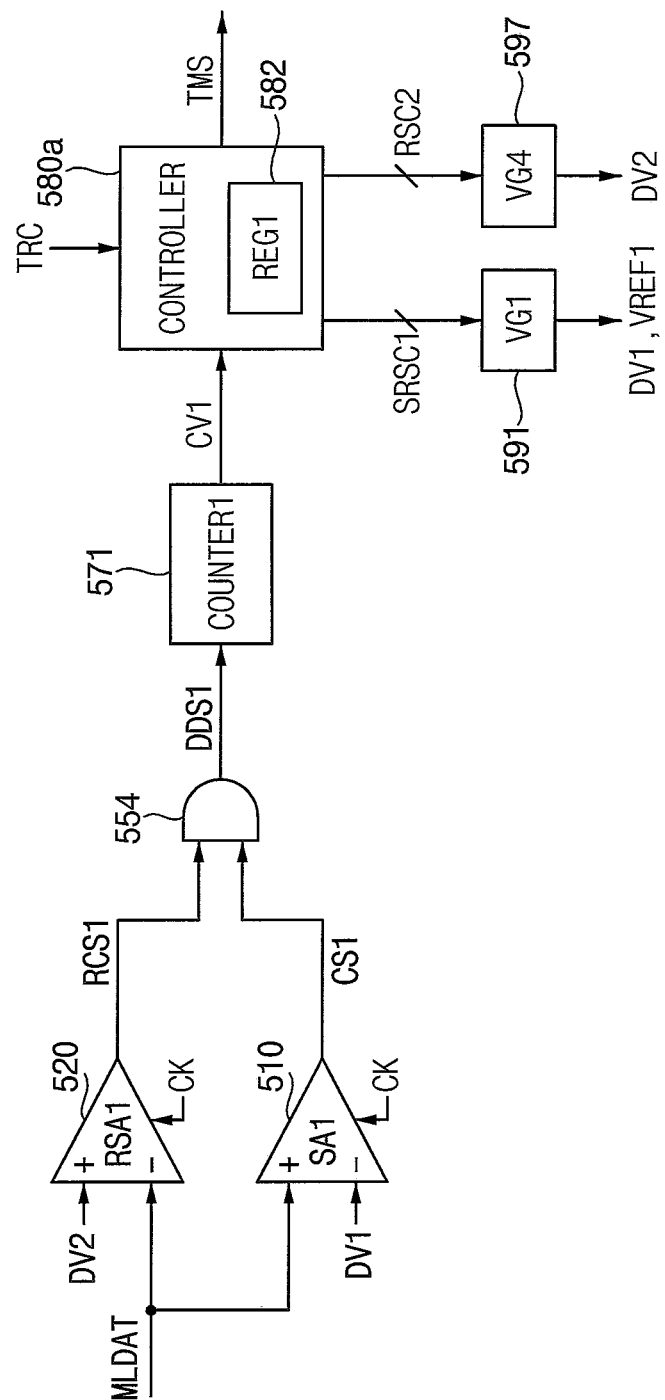
FIG. 19 illustrates a portion of the receiver of FIG. 15 in the training mode.
Figures 20A, 20B:
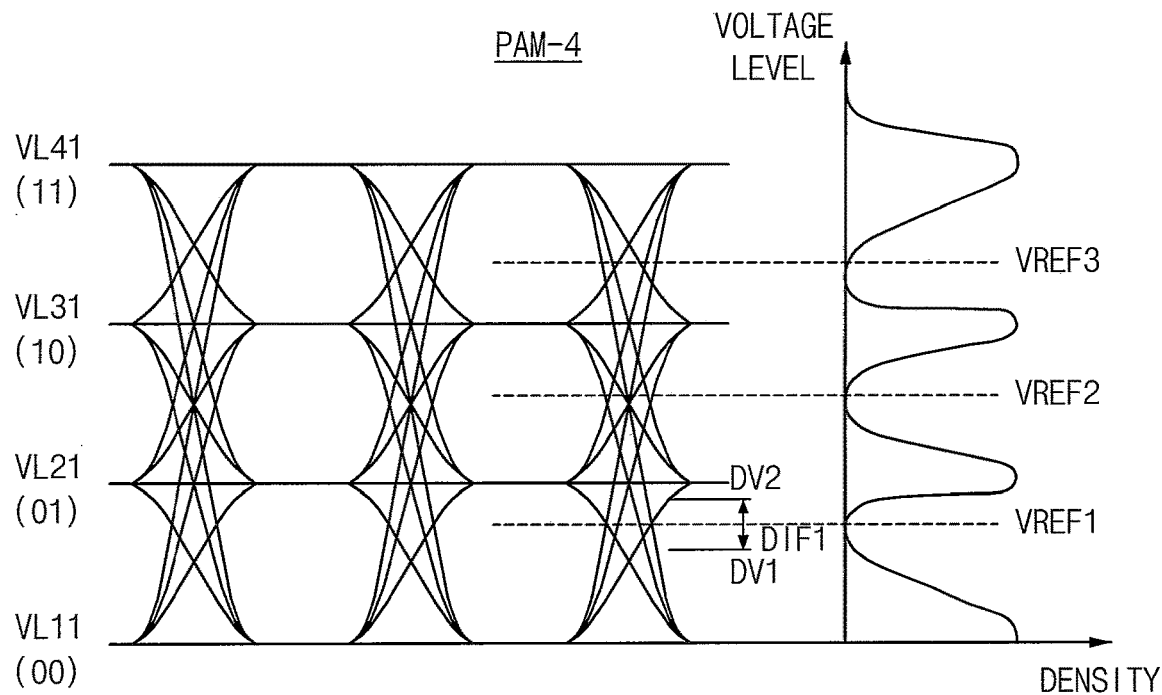
FIG. 20A illustrates the multi-level signal and distribution of the multi-level signal in the training mode.
FIG. 20B illustrates the first register in the receiver of FIG. 15.

FIG. 19 illustrates a portion of the receiver of FIG. 15 in the training mode, FIG. 20A illustrates the multi-level signal and a distribution of the multi-level signal in the training mode and FIG. 20B illustrates the first register in the receiver of FIG. 15.

Referring to FIG. 19, in the training mode, the first sense amplifier 510 compares the multi-level signal MLDAT with the first voltage signal DV1 to output the first comparison signal CST and the first replica sense amplifier 520 compares the multi-level signal MLDAT with the second voltage signal DV2 to output the first replica comparison signal RCS1. The first AND gate 554 performs an AND operation on the first comparison signal CS1 and the first replica comparison signal RCS1 to output the first data density signal DDS1. The first counter 571 may output the first counting value CV1 by counting the first data density signal DDS1 in each of voltage ranges formed by the first level of the first voltage signal DV1 and the second level of the second voltage signal DV2.

The control circuit 580a stores the first counting value CV1 in each of the voltage ranges. The control circuit 580a may adjust the first level of the first voltage signal DV1 by providing the first voltage control code to the first voltage generator 591 and may adjust the second level of the second voltage signal DV2 by providing the second voltage control code (e.g., RSC2) to the fourth voltage generator 597. The control circuit 580a may adjust the first level of the first voltage signal DV1 and the second level of the second voltage signal DV2 such that the first voltage signal DV1 and the second voltage signal DV2 have a first difference (DIF1 in FIG. 20A).

When the first counter 571 completes the counting operation associated with the voltage ranges, the control circuit 580a provides the first voltage generator 591 with a first control code associated with a first minimum counting value among the first counting values CV1 stored in the first register 582, as a first selected control code SRSC1 and the first voltage generator 591 generates the first reference voltage VREF1 in response to the first selected control code SRSC1 in the normal mode.

Referring to FIG. 20B, indices Idx11, Idx12 and Idx13 of the first register 582 may store the first counting value CV1 and the first control code RCS1 associated with voltage ranges.

The first register 581 may include a plurality of columns 582a, 582b and 582c. The column 582a may store a plurality of voltage ranges DV11~DV21, DV12~DV22 and DV13~DV23. The column 582b may store counting values CV11, CV12 and CV13 and each of the counting values CV11, CV12 and CV13 may correspond to respective one of the voltage ranges DV11~DV21, DV12~DV22 and DV13~DV23. The column 582c may store control codes RCS11, RCS12 and RCS13 and each of the control codes RCS11, RCS12 and RCS13 may correspond to respective one of the counting values CV11, CV12 and CV13.

When the counting value CV11 is greater than the counting value CV12 and the counting value CV13 is greater than the counting value CV11, the control circuit 580a may provide the first voltage generator 591 with the control code RCS12 associated with the counting value CV12 (e.g., a minimum counting value) as the first selected control code. The control circuit 580a may determine boundaries that identify bits of the multi-level signal MLDAT based on a maximum counting value that is greatest from among the counting values CV11, CV12 and CV13.

Referring to FIG. 20A, a waveform of the signal MLDAT and density of the multi-level signal MLDAT, distributed between the first voltage signal DV1 and the second voltage signal DV2 during a determined time interval are illustrated. The control circuit 580a may determine voltage levels at which the density (e.g., counting value) has a minimum value as the first, second and third reference voltages VREF1, VREF2 and VREF3.

Figure 21:
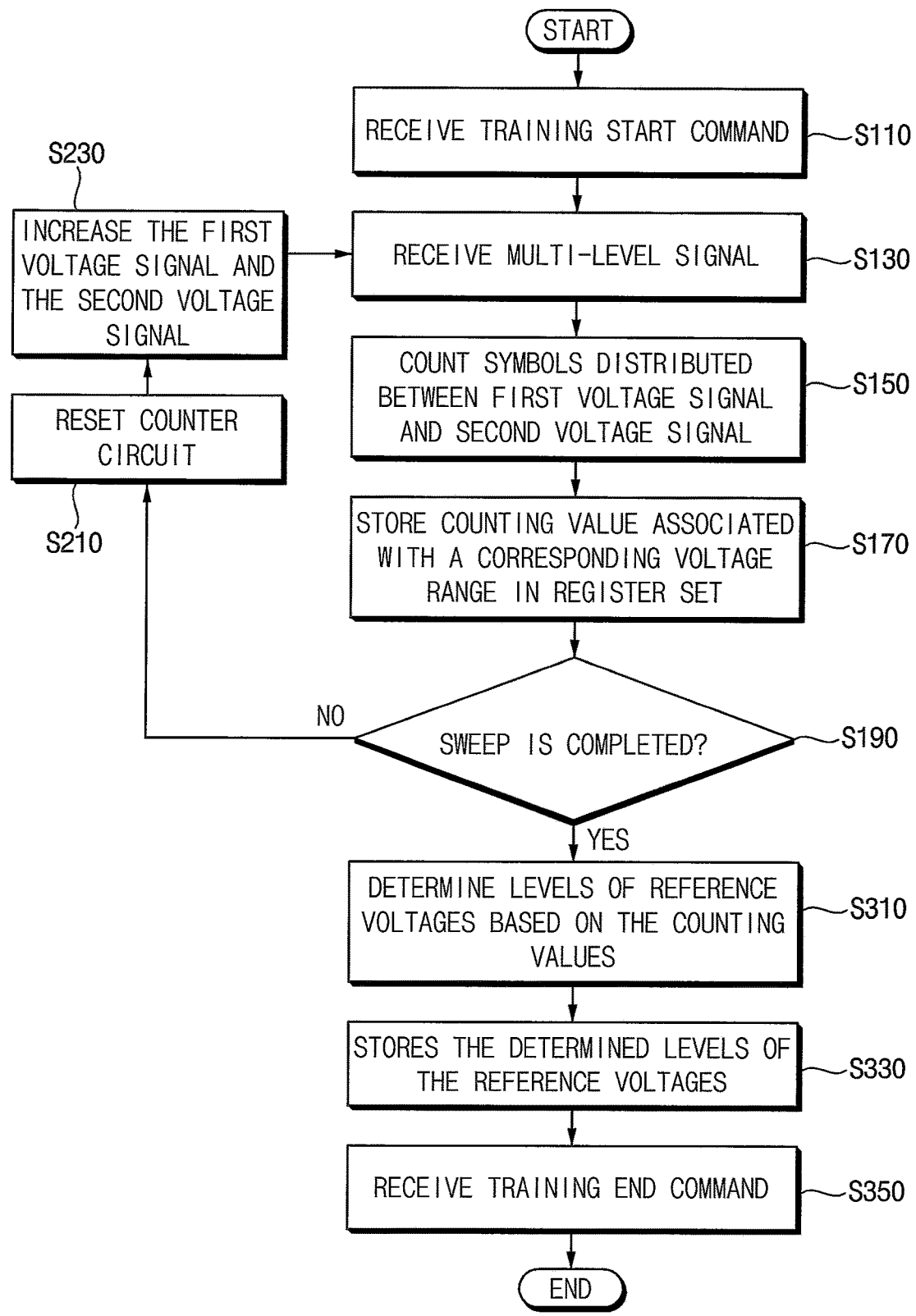
FIG. 21 is a flowchart illustrating a method in which a receiver according to example embodiments of the present disclosure performs a reference voltage training.

FIG. 21 is a flowchart illustrating a method in which a receiver according to example embodiments of the present disclosure performs a reference voltage training.

Referring to FIG. 14 through 21, the receiver 500a receives a training start command from the memory controller 100 (operation S110) and receives the multi-level signal MLDAT (operation S130). The data processing circuit 505a and the counter circuit 570a count symbols distributed between the first voltage signal DV1 and the second voltage signal DV2 (operation S150). The control circuit 580a stores the counting value CV associated with a corresponding voltage range in the register set 581 (operation S170). The control circuit 580a determines whether a sweep on voltage levels of the multi-level signal MLDAT is completed (operation S190).

When the sweep on voltage levels of the multi-level signal MLDAT is not completed (NO operation S190), the control circuit 580a resets the counter circuit 570a (operation S210) and increases the first voltage signal DV1 and the second voltage signal DV2 such that the first voltage signal DV1 and the second voltage signal DV2 have a first difference (operation S230). Then, the control circuit 580a repeats the operations S130, S150, S170 and S190.

When the sweep on voltage levels of the multi-level signal MLDAT is completed (YES operation S190), the control circuit 580a determines levels of the reference voltages based on the counting values stored in the register set 581 (operation S310), and stores the determined levels of the reference voltages in the mode register (e.g., 212 in FIG. 5A). Alternatively, the control circuit 580a stores the determined levels of the reference voltages in a register in the voltage generation circuit 590a. The receiver 500a receives a training end command from the memory controller 100 (operation S350) and terminates the reference voltage training.

Figure 22:
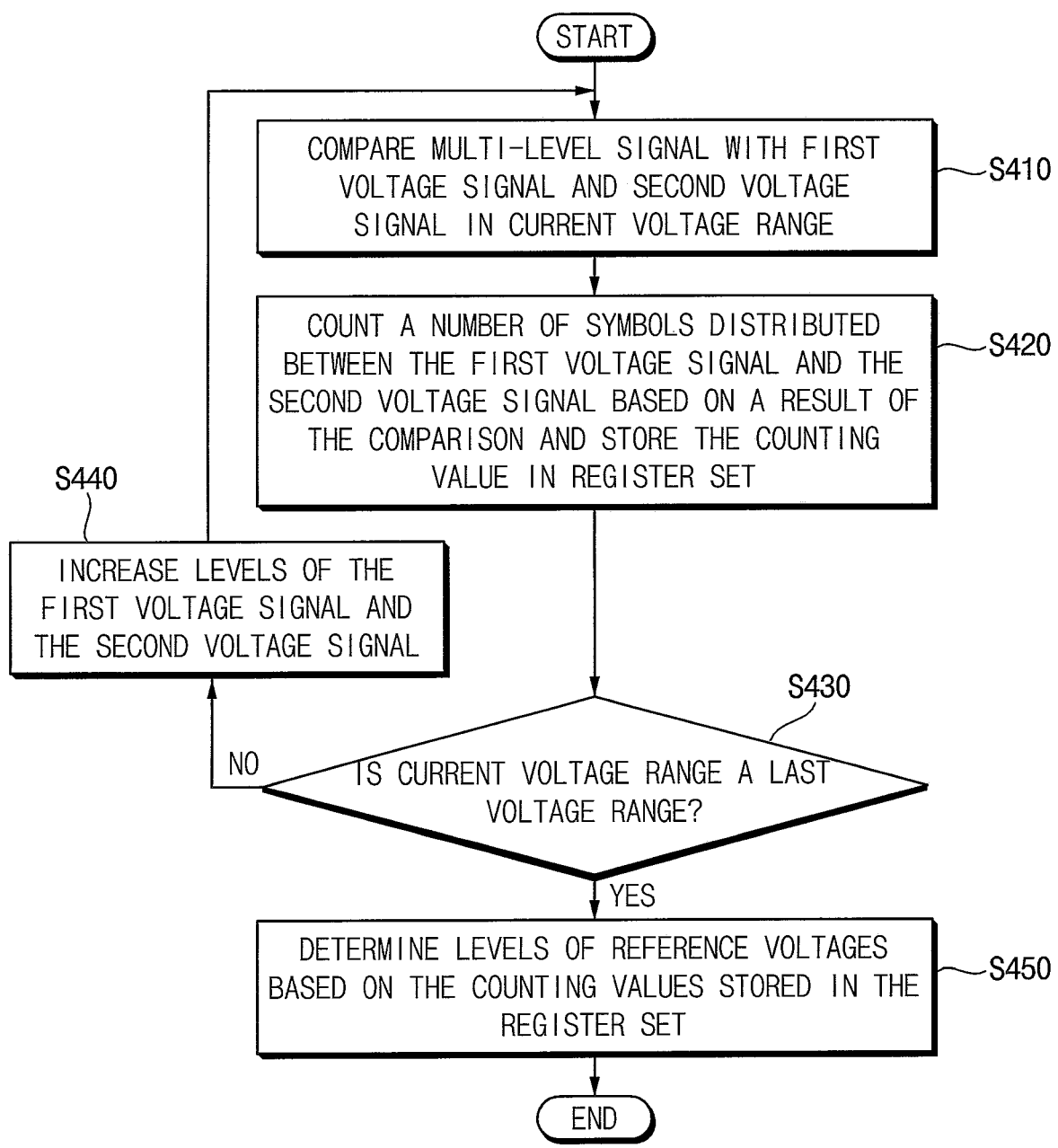
FIG. 22 is a flowchart illustrating a method of performing a reference voltage training in a receiver in a semiconductor memory device according to one or more example embodiments of the present disclosure.

FIG. 22 is a flow chart illustrating a method of performing a reference voltage training in a receiver in a semiconductor memory device according to one or more example embodiments of the present disclosure.

Referring to FIGS. 14 through 20B and 22, to perform a reference voltage training, the receiver 500a consecutively compares the multi-level signal MLDAT with the first voltage signal DV1 and the second voltage signal DV2 in a current voltage range (operation S410). The receiver 500a counts a number of symbols associated with the multi-level signal MLDAT distributed between the first voltage signal DV1 and the second voltage signal DV1 based on a result of the comparison and stores the counting value CV in the register set 581 (operation S420).

The control circuit 580a in the receiver 500a determines whether the current voltage range is a last voltage range of the multi-level signal MLDAT (operation S430). When the current voltage range is lot the last voltage range (NO in operation S430), the control circuit 580a increases levels of the first voltage signal DV1 and the second voltage signals DV2 (operation S440) and the receiver 500 repeats the operations S410 and S420. When the current voltage range is the last voltage range (NO in operation S430), the control circuit 580a determines levels of reference voltages based on a minimum counting value among from the counting values stored in the register set 581 (operation S450).

Therefore, the receiver according to example embodiments of the present disclosure, in the training mode, performs a reference voltage training by counting a number of symbols associated with the multi-level data in each of voltage ranges, stores the counting values and determines a reference voltage associated with a minimum counting value among the stored counting values and thus may determine the reference voltage optimally without original data. Therefore, the control circuit in the receiver according to example embodiments of h present disclosure may perform the reference voltage training on reference voltages concurrently with the multi-level data applied to a plurality of data input/output (I/O) pads of a semiconductor memory device. Accordingly; performance of the receiver and performance of a semiconductor memory device including the receiver may be enhanced. In addition, when a memory controller controls a memory module including a plurality of semiconductor memory devices, reference voltage trainings on receivers in the semiconductor memory devices may be performed concurrently.

Figure 23:
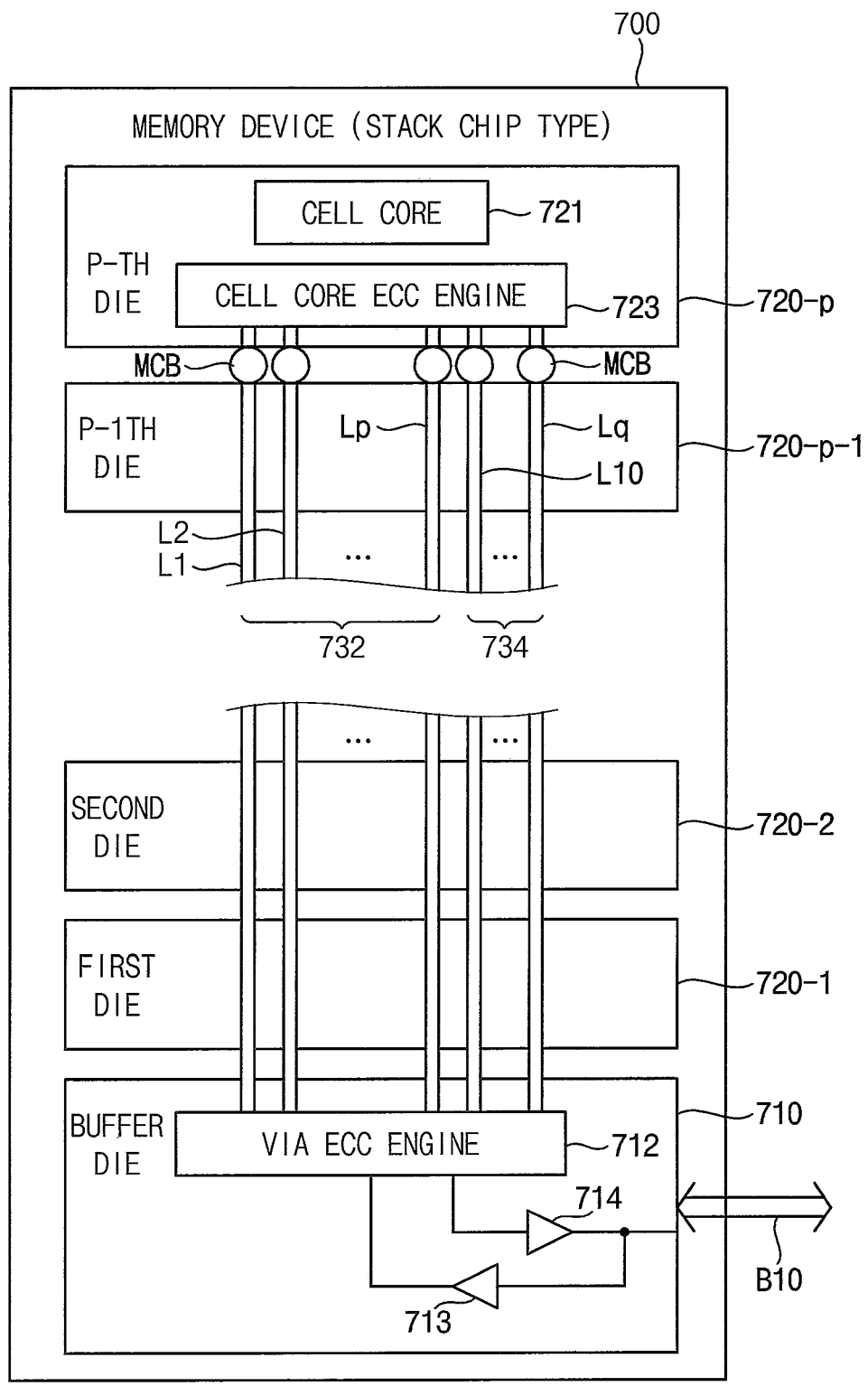
FIG. 23 is a block diagram illustrating a semiconductor memory device according to one or more example embodiments of the present disclosure.

FIG. 23 is a block diagram illustrating a semiconductor memory device according to one or more example embodiments of the present disclosure.

Referring to FIG. 23, a semiconductor memory device 700 may include at least one buffer die 710 and a plurality of memory dies 720-1 to 720-p (p is a natural number equal to or greater than three) providing a soft error analyzing and correcting function in a stacked chip structure.

The plurality of memory dies 720-1 to 720-p are stacked on the buffer die 710 and convey data through a plurality of through silicon via (TSV) lines.

At least one of the memory dies 720-1 to 720-p may include a cell core 721 to store data and a cell core ECC engine 723 which generates transmission parity bits (e.g., transmission parity data) based on transmission data to be sent to the at least one buffer die 710. The cell core 721 may include a plurality of memory cells having DRAM cell structure.

The buffer die 710 may include a via ECC engine 712 which corrects a transmission error using the transmission parity bits when a transmission error is detected from the transmission data received through the TSV lines and generates error-corrected data.

The buffer die 710 may further include a receiver 713 and a transmitter 714. The receiver 713 may be the receiver 500 of FIG. 14. Therefore, the receiver 713 receives a multi-level signal having one of M voltage levels different from each other, and may determine a voltage level of the multi-level signal by using M−1 sense amplifiers. In addition, the receiver 713 in the training mode, may perform a reference voltage training by counting a number of symbols associated with the multi-level data in each of voltage ranges, storing the counting values and determining a reference voltage associated with a minimum counting value among the stored counting values and thus may determine the reference voltage optimally without original data and may determine a level of the reference voltage optimally.

The semiconductor memory device 700 may be a stack chip type memory device or a stacked memory device which conveys data and control signals through the TSV lines. The TSV lines may be also called 'through electrodes'.

The cell core ECC engine 723 may perform error correction on data which is outputted from the memory die 720-$p$ before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 732 which is formed at one memory die 720-$p$ may include TSV lines L1 to Lp, and a parity TSV line group 734 may include TSV lines L10 to Lq. The TSV lines L1 to Lp of the data TSV line group 732 and the parity TSV lines L10 to Lq of the parity TSV line group 734 may be connected to micro bumps MCB which are correspondingly formed among the memory dies 720-1 to 720-$p$.

At least one of the memory dies 720-1 to 720-$p$ may include DRAM cells each including at least one access transistor and one storage capacitor.

The semiconductor memory device 700 may have a three-dimensional (3D) chip structure chip structure to communicate with the host through a data bus B10. The buffer die 710 may be connected with the memory controller through the data bus B10.

The cell core ECC engine 723 may output transmission parity bits as well as the transmission data through the parity TSV line group 734 and the data ISV line group 732 respectively. The outputted transmission data may be data which is error-corrected by the cell core ECC engine 723.

The via ECC engine 712 may determine whether a transmission error occurs at the transmission data received through the data TSV line group 732, based on the transmission parity bits received through the parity TSV line group 734. When a transmission error is detected, the via ECC engine 712 may correct the transmission error on the transmission data using the transmission parity bits. When the transmission error is uncorrectable, the via ECC engine 712 may output information indicating the occurrence of an uncorrectable data error.

Figure 24:
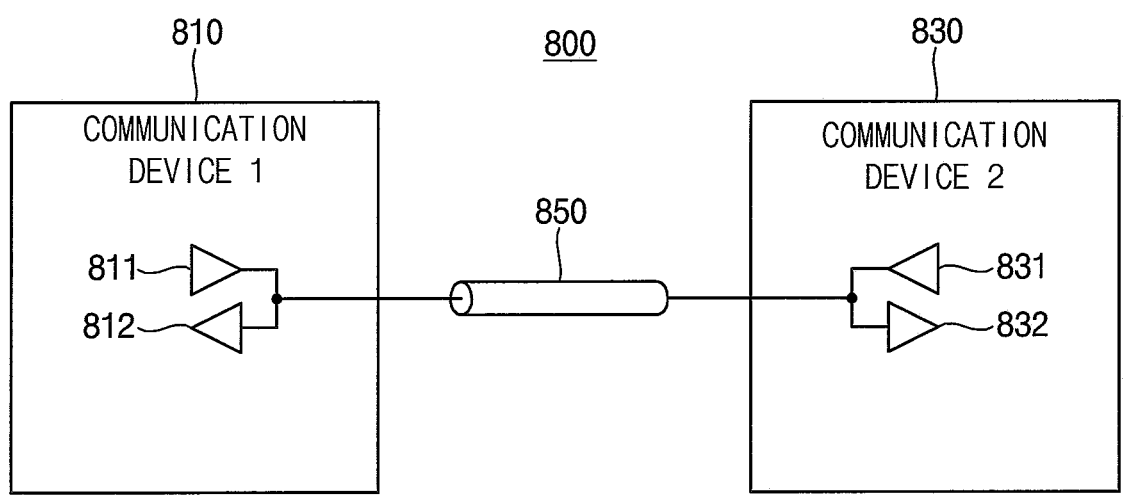
FIG. 24 is a block diagram illustrating a communication system according to one or more example embodiments of the present disclosure.

FIG. 24 is a block diagram illustrating a communication system according to one or more example embodiments of the present disclosure.

Referring to FIG. 24, a communication system 800 includes a first communication device 810, a second communication device 830 and a channel 850.

The first communication device 810 includes a first transmitter 811 and a first receiver 812. The second communication device 830 includes a second transmitter 831 and a second receiver 832. The first transmitter 811 and the first receiver 812 are connected to the second transmitter 831 and the second receiver 832 through the channel 850. In some example embodiments of the present disclosure, each of the first and second communication devices 810 and 830 may include a plurality of transmitters and a plurality of receivers, and the communication system 800 may include a plurality of channels for connecting the plurality of transmitters and a plurality of receivers.

The first and second receivers 812 and 832 may be the receiver according to one or more example embodiments of the present disclosure, may perform a reference voltage training in a training mode and may determine a level of a reference voltage optimally.

The present disclosure may be applied to various devices and systems that include the aforementioned memory devices and the memory systems. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

While the present disclosure has been shown and described with reference to example embodiments thereof, it will be apparent to those of ordinary skill in the art that many modifications in form and details may be made thereto without departing from the spirit and scope of the present disclosure as set forth by the following claims.

What is claimed is:

1. A receiver included in a semiconductor memory device, the receiver comprising:
  a data processing circuit, in a raining mode, configured to compare a multi-level signal with a first voltage signal and compare the multi-level signal with a second voltage signal having a first difference with respect to the first voltage signal, and configured to generate data density signals indicating a number of symbols associated with the multi-level signal between the first voltage signal and the second voltage signal, the multi-level signal having one of M voltage levels different from each other, M being an integer greater than two;
  a counter circuit configured to perform a counting operation on the data density signals to generate counting values;
  a control circuit configured to store, in a register set, a voltage range, counting values corresponding to the voltage range and a control code associated with a first level of the first voltage signal and a second level of the second voltage signal, the voltage range being based on the first voltage signal and the second voltage signal; and a voltage generation circuit, in the training mode, configured to apply the first voltage signal and the second voltage signal to the data processing circuit and configured to increase the first level of the first voltage signal and the second level of the second voltage level by the first difference in response to the control code from the control circuit, and wherein the control circuit is configured to perform a reference voltage training to select a control code associated with a reference voltage provided to the data processing circuit in a normal mode, based on the counting values stored m the register set.

2. The receiver of claim 1, wherein the control circuit is configured to reset the counter circuit after the counter circuit completes the counting operation associated with a current voltage range;

the control circuit is configured to provide the voltage generation circuit with a control code associated with a minimum voltage range corresponding to a minimum counting value among the counting values stored in the register set, as a selected control code; and the voltage generation circuit s configured to apply at least one reference voltage to the data processing circuit in response to the selected control code in the normal mode.

3. The receiver of claim 2, wherein the data processing circuit is configured to compare the multi-level signal with (M−1) reference voltages to generate (M−1) comparison signals in the normal mode, and wherein the receiver further comprises: an output decoder configured to generate a target data signal including N bits based on the (M−1) comparison signals, N being an integer greater than one.

4. The receiver of claim 1, wherein the M voltage levels include a first voltage level, a second voltage level greater than the first voltage level, a third voltage level greater than the second voltage level and a fourth voltage level greater than the third voltage level, and wherein the data processing circuit includes:

first, second and third sense amplifiers, each configured to output a respective one of first, second and third comparison signals by comparing the multi-level signal with the first voltage signal, in response to a clock signal in the training mode;

first, second and third replica sense amplifiers, each configured to output a respective one of first, second and third replica comparison signals by comparing the multi-level signal with the second voltage signal, in response to the clock signal in the training mode;

first, second and third AND gates, each configured to perform an AND operation on a respective one of the first through third comparison signals and a respective one of the first through third replica comparison signals to generate a respective one of first, second and third data density signals, in the training mode; and a clock generator configured to generate the clock signal.

5. The receiver of claim 4, wherein each of the first through third sense amplifiers includes a positive input terminal to receive the multi-level signal and a negative input terminal to receive the first voltage signal, and wherein each of the first through third replica sense amplifiers includes a positive input terminal to receive the second voltage signal and a negative input terminal to receive the multi-level signal.

6. The receiver of claim 4, wherein the data processing circuit further includes:

first, second and third demultiplexers, each configured to provide a respective one of the first through third comparison signals to a respective one of the first through third AND gates in the training mode and configured to provide a respective one of the first through third comparison signals to an output decoder in the normal mode, in response to a training mode signal from the control circuit.

7. The receiver of claim 6, wherein the control circuit is configured to maintain the training mode signal at a logic high level when the control circuit performs the reference voltage training, in response to a training command.

8. The receiver of claim 4, wherein the counter circuit includes:

first, second and third counters, each configured to count a respective one of the first through third data density signals to output a respective one of first, second and third counting values, in the training mode.

9. The receiver of claim 8, wherein the register set includes:

first, second and third registers, each configured to store a respective one of the first through third counting values, a respective one of voltage ranges associated with a respective one of the first through third counting values and a respective one of control codes associated with a respective one of the voltage ranges.

10. The receiver of claim 8, wherein, in the normal mode, the control circuit is configured to:

provide a first voltage generator in the voltage generation circuit with a first control code associated with a first minimum counting value among the first counting values stored in the first register, as a first selected control code;

provide a second voltage generator in the voltage generation circuit with a second control code associated with a second minimum counting value among the second counting values stored in the second register, as a second selected control code; and provide a third voltage generator in the voltage generation circuit with a third control code associated with a third minimum counting value among the third counting values store in the third register, as a third selected control code, and wherein, in the normal mode:

the first voltage generator is configured to generate a first reference voltage based on the first selected control code;

the second voltage generator s configured to generate a second reference voltage based on the second selected control code; and the third voltage generator is configured to generate a third reference voltage based on the third selected control code.

11. The receiver of claim 10, wherein the control circuit is configured to provide the first voltage generator with the first selected control code based on an average of the first level of the first voltage signal and the second level of the second voltage signal associated with the first minimum counting value.

12. The receiver of claim 8, wherein the control circuit is configured to determine boundaries based on a maximum counting value from among the first through third counting values.

13. The receiver of claim 4, wherein the voltage generation circuit includes:
- a fast voltage generator configured to generate the first voltage signal in response to a first control code to provide the first voltage signal to the first sense amplifier in the training mode, and configured to generate a first reference voltage in response to a first selected control code to provide the first reference voltage to the first sense amplifier in the normal mode;
- a second voltage generator configured to generate the first voltage signal in response to the first control code to provide the first voltage signal to the second sense amplifier in the training mode, and configured to generate a second reference voltage in response to a second selected control code to provide the second reference voltage to the second sense amplifier in the normal mode;
- a third voltage generator configured to generate the first voltage signal in response to the first control code to provide the first voltage signal to the third sense amplifier in the training mode, and configured to generate a third reference voltage in response to a third selected control code to provide the third reference voltage to the third sense amplifier in the normal mode; and
- a fourth voltage generator configured to generate the second voltage signal in response to a second control code to provide the second voltage signal to the first through third replica sense amplifiers in the training mode.

14. The receiver of claim 4, wherein the first sense amplifier includes:
- a first p-channel metal-oxide semiconductor (PMOS) transistor connected between a power supply voltage and a first node, wherein a gate of the first PMOS transistors is connected to a second node;
- a second PMOS transistor connected between the power supply voltage and the second node, wherein a gate of the second PMOS transistor is connected to the first node;
- a third PMOS transistor connected between the power supply voltage and the first node in parallel with the first PMOS transistor, wherein a gate of the third PMOS transistors receives the clock signal;
- a fourth PMOS transistor connected between the power supply voltage and the second node in parallel with the second PMOS transistor, wherein a gate of the fourth PMOS transistor receives the clock signal;
- a first n-channel metal-oxide semiconductor (NMOS) transistor connected between the first node and a third node, wherein a gate of the first NMOS transistor is connected to the second node;
- a second NMOS transistor connected between the second node and a fourth node, wherein a gate of the second NMOS transistor is connected to the first node;
- a third NMOS transistor connected between the third node and a fifth node, wherein a gate of the third NMOS transistor receives the multi-level signal;
- a fourth NMOS transistor connected between the fourth node and the fifth node, wherein a gate of the fourth NMOS transistor receives the first voltage signal in the training mode and receives a first reference voltage in the normal mode; and
- a fifth NMOS transistor connected between the fifth node and a ground voltage, wherein a gate of the fifth NMOS transistor receives the clock signal;
- a sixth NMOS transistor connected between the third node and the fourth node, wherein a gate of the sixth NMOS transistor receives the clock signal;
- wherein the first sense amplifier outputs the first comparison signal at the second node.

15. The receiver of claim 4, wherein the control circuit is configured to perform the reference voltage training on the first through third sense amplifiers concurrently.

16. A memory system, comprising:
- a memory controller configured to generate a multi-level signal based on input data, the multi-level signal having one of M voltage levels different from each other, M being an integer greater than two; and
- a semiconductor memory device including at least one receiver configured to receive the multi-level signal from the memory controller and configured to compare the multi-level signal with (M−1) reference voltages to generate a target data signal including N bits, N being an integer greater than one,
- wherein the at least one receiver includes:
  - a data processing circuit, in a training mode, configured to compare the multi-level signal with a first voltage signal and compare the multi-level signal with a second voltage signal having a first difference from the first voltage signal, and configured to generate data density signals indicating a number of symbols associated with the multi-level signal between the first voltage signal and the second voltage signal;
  - a counter circuit configured to perform a counting operation on the data density signals to generate counting values;
  - a control circuit configured to store, in a register set, a voltage range, counting values corresponding to the voltage range and a control code associated with a first level of the first voltage signal and a second level of the second voltage signal, the voltage range being based on the first voltage signal and the second voltage signal; and
  - a voltage generation circuit, in the training mode, configured to apply the first voltage signal and the second voltage signal to the data processing circuit and configured to increase the first level of the first voltage signal and the second level of the second voltage signal by the first difference in response to the control code from the control circuit, and
  - wherein the control circuit, is configured to perform a reference voltage training to select a control code associated with a reference voltage provided to the data processing circuit in normal mode, based on the counting values stored in the register set.

17. The memory system of claim 16, wherein:
- the at least one receiver includes a plurality of receivers connected to a plurality of data input/output (I/O) pads connected to the memory controller through a channel;
- the semiconductor memory device is configured to perform the reference voltage training on the plurality of receivers concurrently;
- the semiconductor memory device further includes a memory cell array including a plurality memory cells coupled to a plurality of word-lines and a plurality of bit-lines, the memory cell array storing the target data signal, and
- each of the plurality of memory cells has a dynamic random access memory (DRAM) cell.

18. The memory system of claim 16, wherein:
the control circuit is configured to provide the voltage generation circuit with a control code associated with a minimum voltage range corresponding to a minimum counting value among the counting values stored in the register set, as a selected control code; and the voltage generation circuit is configured to apply at least one reference voltage to the data processing circuit in the normal mode.

19. The memory system of claim 16, wherein the M voltage levels include first voltage level, a second voltage level greater than the first voltage level, a third voltage level greater than the second voltage level and a fourth voltage level greater than the third voltage level, and wherein the data processing circuit includes:

first, second and third sense amplifiers, each configured to output a respective one of first, second and third comparison signals by comparing the multi-level signal with the first voltage signal, in response to a clock signal in the training mode;

first, second and third replica sense amplifiers, each configured to output a respective one of first, second and third replica comparison signals by comparing the multi-level signal with the second voltage signal, in response to the dock signal in the training mode;

first, second and third AND gates, each configured to perform an AND operation on a respective one of the first through third comparison signals and a respective one of the first through third replica comparison signals to generate a respective one of first, second and third data density signals, in the training mode; and a clock generator configured to generate the clock signal, and wherein the semiconductor memory device further includes a memory cell array including a plurality nonvolatile memory cells coupled to a plurality of word-lines and a plurality of bit-lines, the memory cell array storing the target data signal.

20. A receiver included in a semiconductor memory device, the receiver comprising:

a data processing circuit, in a training mode, configured to consecutively compare a multi-level signal with a first voltage signal and a second voltage signal having a first difference from the first voltage, and configured to generate first, second and third data density signals indicating a number of symbols associated with the multi-level signal distributed between the first voltage signal and the second voltage signal, the multi-level signal having one of first, second, third and fourth voltage levels different from each other;

a counter circuit configured to perform a counting operation on the first through third data density signals to generate first, second and third counting values;

a control circuit configured to store, in a register set therein, a voltage range, the first through third counting values corresponding to the voltage range and a control code associated with a first level of the first voltage signal and a second level of the second voltage signal, the voltage range being based on the first voltage signal and the second voltage signal; and a voltage generation circuit, in the training mode, configured to apply the first voltage signal and the second voltage signal to the data processing circuit and configured to increase the first level and the second level by the first difference step-wisely in response to the control code from the control circuit, wherein the control circuit is configured to perform a reference voltage training to select a control code associated with a reference voltage provided to the data processing circuit in a normal mode, based on the first through third counting values stored in the register set, the control circuit is configured to provide the voltage generation circuit with control codes associated with a minimum voltage range corresponding to a minimum counting value among a respective one of the first through third counting values stored in the register set, as first, second and third selected control codes, and the voltage generation circuit is configured to provide first, second and third reference voltages to the data processing circuit response to a respective one of the first through third selected control codes in the normal mode.

* * * * *